United States Patent
Gutman et al.

(10) Patent No.: US 12,143,082 B2
(45) Date of Patent: Nov. 12, 2024

(54) ENHANCED AUTOMATIC GAIN CONTROL FOR FULL-DUPLEX IN MILLIMETER WAVE SYSTEMS

(71) Applicant: QUALCOMM Incorporated, San Diego, CA (US)

(72) Inventors: Igor Gutman, Hod Hasharon (IL); Alexander Dorosenco, El Cajon, CA (US); Tao Luo, San Diego, CA (US); Navid Abedini, Basking Ridge, NJ (US)

(*) Notice: Subject to any disclaimer, the term of this patent is extended or adjusted under 35 U.S.C. 154(b) by 0 days.

(21) Appl. No.: 17/581,281

(22) Filed: Jan. 21, 2022

(65) Prior Publication Data

US 2023/0299731 A1   Sep. 21, 2023

(51) Int. Cl.
    *H03G 3/30*    (2006.01)
    *H03F 3/19*    (2006.01)
    *H03M 1/12*    (2006.01)
    *H04B 1/04*    (2006.01)
    *H04L 5/14*    (2006.01)

(52) U.S. Cl.
    CPC ............ *H03G 3/3036* (2013.01); *H03F 3/19* (2013.01); *H03M 1/124* (2013.01); *H04B 1/04* (2013.01); *H03F 2200/294* (2013.01); *H03F 2200/451* (2013.01); *H03G 2201/103* (2013.01); *H04B 2001/0416* (2013.01); *H04L 5/1461* (2013.01)

(58) Field of Classification Search
    CPC . H04B 1/04; H04B 2001/0416; H04L 5/1461; H03M 1/124; H03G 3/3036; H03G 2201/103; H03F 3/19; H03F 2200/294; H03F 2200/451

USPC ......................................................... 375/297
See application file for complete search history.

(56) References Cited

U.S. PATENT DOCUMENTS 5,828,328 A * 10/1998 Marks .................. H03M 1/187
                                                   341/139
7,676,208 B2    3/2010 Lee et al.
(Continued)

FOREIGN PATENT DOCUMENTS

EP           1160985 A1 * 12/2001   ............ H03M 1/187
JP          01241223 A   *  9/1989
KR         2010104209 A  *  9/2010

OTHER PUBLICATIONS

JP-01241223-A machine translation (Year: 1989).*
(Continued)

*Primary Examiner* — Kevin M Burd

(57) ABSTRACT

Methods, systems, and devices for wireless communications are described. In some cases, a device may perform a first analog to digital conversion (ADC) to generate a first set of samples of a wireless signal, and may attenuate the signal according to a dynamic range. The device may then perform a second ADC on the attenuated signal to generate a second set of samples, amplify the second set of samples, output whichever set of samples is greater. In some other cases, the second ADC may determine to attenuate the wireless signal based on an input power, amplify the signal, and output the amplified samples. In some other cases, the wireless device may determine an estimated input power of the wireless signal at a number of antenna elements. The device may then determine an adjustment to gain states of low-noise amplifiers (LNA) associated with each of the number of antenna elements.

22 Claims, 17 Drawing Sheets

(56) References Cited

U.S. PATENT DOCUMENTS

| | | |
|---|---|---|
| 9,590,740 B1 | 3/2017 | Pace et al. |
| 10,476,539 B1 | 11/2019 | Berger et al. |
| 2010/0085231 A1* | 4/2010 | Doris .................... H03M 1/188 |
| | | 341/155 |

OTHER PUBLICATIONS

Partial International Search Report—PCT/US2023/010771—ISA/EPO—May 11, 2023 (2105932WO).
International Search Report and Written Opinion—PCT/US2023/010771—ISA/EPO—Aug. 17, 2023 (2105932WO).

* cited by examiner

ENHANCED AUTOMATIC GAIN CONTROL FOR FULL-DUPLEX IN MILLIMETER WAVE SYSTEMS

FIELD OF TECHNOLOGY

The following relates to wireless communications, including enhanced automatic gain control (AGC) for full-duplex in millimeter wave (mmW) systems.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

Some wireless communications devices may be equipped with full-duplex capabilities to increase signaling throughput and to support simultaneous communications on both uplink and downlink. In some cases, however, full-duplex communications may be associated with significant self-interference imposed by one or more transmit antennas on one or more receive antennas within a wireless device.

SUMMARY

The described techniques relate to improved methods, systems, devices, and apparatuses that support enhanced automatic gain control (AGC) for full-duplex in millimeter wave systems. Generally, the described techniques support signaling between devices with full-duplex capabilities, which may be subject to higher rates of self-interference that may push a signal outside of the dynamic range of various signal processing components of the wireless device. The wireless device may implement a number of different signal processing techniques to keep a received signal within the dynamic range.

In some examples, a device may perform a first analog to digital conversion (ADC) to generate a first set of samples of the wireless signal, and may attenuate the signal according to the dynamic range. The device may then perform a second ADC on the attenuated signal to generate a second set of samples, and may amplify the second set of samples. The device may then output whichever set of samples is greater. In some other examples, the second ADC may determine whether the wireless signal would saturate the first ADC based on an input power of the wireless signal, and may determine to attenuate the wireless signal based on the determined input power. After attenuation, the device may amplify and output samples of the wireless signal. In some other examples, the wireless device may determine an estimated input power of the wireless signal at a number of antenna elements of the device. The device may then determine an adjustment to gain states of the low-noise amplifiers (LNA) associated with each of the number of antenna elements so that the output of the LNAs do not saturate the ADC.

A method for wireless communication at a wireless device is described. The method may include performing a first ADC of a wireless signal corresponding to a dynamic range to generate a first sample of the wireless signal, attenuating the wireless signal by a factor to generate an attenuated wireless signal, performing a second ADC on the attenuated wireless signal corresponding to the dynamic range to generate a second sample of the attenuated wireless signal, amplifying the second sample by the factor, and outputting one of the first sample or the second sample.

An apparatus for wireless communication at a wireless device is described. The apparatus may include a processor, memory coupled with the processor, and instructions stored in the memory. The instructions may be executable by the processor to cause the apparatus to perform a first ADC of a wireless signal corresponding to a dynamic range to generate a first sample of the wireless signal, attenuate the wireless signal by a factor to generate an attenuated wireless signal, perform a second ADC on the attenuated wireless signal corresponding to the dynamic range to generate a second sample of the attenuated wireless signal, amplify the second sample by the factor, and output one of the first sample or the second sample.

Another apparatus for wireless communication at a wireless device is described. The apparatus may include means for performing a first ADC of a wireless signal corresponding to a dynamic range to generate a first sample of the wireless signal, means for attenuating the wireless signal by a factor to generate an attenuated wireless signal, means for performing a second ADC on the attenuated wireless signal corresponding to the dynamic range to generate a second sample of the attenuated wireless signal, means for amplifying the second sample by the factor, and means for outputting one of the first sample or the second sample.

A non-transitory computer-readable medium storing code for wireless communication at a wireless device is described. The code may include instructions executable by a processor to perform a first ADC of a wireless signal corresponding to a dynamic range to generate a first sample of the wireless signal, attenuate the wireless signal by a factor to generate an attenuated wireless signal, perform a second ADC on the attenuated wireless signal corresponding to the dynamic range to generate a second sample of the attenuated wireless signal, amplify the second sample by the factor, and output one of the first sample or the second sample.

In some examples of the method, apparatuses, and non-transitory computer-readable medium described herein, the outputting one of the first sample or the second sample may include operations, features, means, or instructions for outputting a greater of the first sample or the second sample based on a comparison of the first sample and the second sample.

In some examples of the method, apparatuses, and non-transitory computer-readable medium described herein, the dynamic range corresponding to the second ADC may be shifted relative to the dynamic range corresponding to the first ADC based on the attenuating and the method, apparatuses, and non-transitory computer-readable medium may include further operations, features, means, or instructions for amplifying the second sample to equalize the dynamic range corresponding to the first ADC and the second ADC.

In some examples of the method, apparatuses, and non-transitory computer-readable medium described herein, the factor corresponds to a number of decibels for attenuating the wireless signal and for amplifying the second sample.

In some examples of the method, apparatuses, and non-transitory computer-readable medium described herein, the first ADC includes a main ADC and the second ADC includes a secondary ADC.

In some examples of the method, apparatuses, and non-transitory computer-readable medium described herein, the wireless signal includes an in-phase signal, a quadrature signal, or both.

A method for wireless communication at a wireless device is described. The method may include performing a first ADC of a wireless signal to determine an estimated power of the wireless signal, attenuating the wireless signal by a factor to generate an attenuated wireless signal based on the estimated power satisfying a threshold, performing a second ADC on the attenuated wireless signal to generate a sample of the attenuated wireless signal, amplifying the sample by the factor based on the estimated power satisfying the threshold, and outputting the sample.

An apparatus for wireless communication at a wireless device is described. The apparatus may include a processor, memory coupled with the processor, and instructions stored in the memory. The instructions may be executable by the processor to cause the apparatus to perform a first ADC of a wireless signal to determine an estimated power of the wireless signal, attenuate the wireless signal by a factor to generate an attenuated wireless signal based on the estimated power satisfying a threshold, perform a second ADC on the attenuated wireless signal to generate a sample of the attenuated wireless signal, amplify the sample by the factor based on the estimated power satisfying the threshold, and output the sample.

Another apparatus for wireless communication at a wireless device is described. The apparatus may include means for performing a first ADC of a wireless signal to determine an estimated power of the wireless signal, means for attenuating the wireless signal by a factor to generate an attenuated wireless signal based on the estimated power satisfying a threshold, means for performing a second ADC on the attenuated wireless signal to generate a sample of the attenuated wireless signal, means for amplifying the sample by the factor based on the estimated power satisfying the threshold, and means for outputting the sample.

A non-transitory computer-readable medium storing code for wireless communication at a wireless device is described. The code may include instructions executable by a processor to perform a first ADC of a wireless signal to determine an estimated power of the wireless signal, attenuate the wireless signal by a factor to generate an attenuated wireless signal based on the estimated power satisfying a threshold, perform a second ADC on the attenuated wireless signal to generate a sample of the attenuated wireless signal, amplify the sample by the factor based on the estimated power satisfying the threshold, and output the sample.

Some examples of the method, apparatuses, and non-transitory computer-readable medium described herein may further include operations, features, means, or instructions for identifying a time interval to monitor for determining the estimated power of the wireless signal, where the first ADC may be performed on the wireless signal during the time interval.

Some examples of the method, apparatuses, and non-transitory computer-readable medium described herein may further include operations, features, means, or instructions for receiving control signaling indicating a time interval to monitor for determining the estimated power of the wireless signal, where the first ADC may be performed on the wireless signal during the time interval.

In some examples of the method, apparatuses, and non-transitory computer-readable medium described herein, the threshold includes a voltage saturation threshold associated with the first ADC.

In some examples of the method, apparatuses, and non-transitory computer-readable medium described herein, a number of bits for the estimated power determined by the first ADC may be fewer than a number of bits included by the first ADC in the sample of the attenuated wireless signal.

Some examples of the method, apparatuses, and non-transitory computer-readable medium described herein may further include operations, features, means, or instructions for outputting, to a baseband processor of the wireless device, a value of the estimated power of the wireless signal based on attenuating the wireless signal.

In some examples of the method, apparatuses, and non-transitory computer-readable medium described herein, the factor includes a number of decibels for attenuating the wireless signal and for amplifying the sample.

In some examples of the method, apparatuses, and non-transitory computer-readable medium described herein, the first ADC includes a main ADC and the second ADC includes a secondary ADC.

A method for wireless communication at a wireless device is described. The method may include determining an estimated input power of a wireless signal received at a first antenna element of a set of multiple antenna elements of the wireless device, determining an adjustment to a gain state of each amplifier of a set of multiple amplifiers of the wireless device based on the estimated input power satisfying a threshold, amplifying a respective wireless signal of a set of multiple wireless signals received via a respective antenna element of the set of multiple antenna elements to generate set of multiple amplified signals based on the adjustment to the gain state, and performing an ADC on the set of multiple amplified signals to generate a set of multiple samples of the set of multiple wireless signals.

An apparatus for wireless communication at a wireless device is described. The apparatus may include a processor, memory coupled with the processor, and instructions stored in the memory. The instructions may be executable by the processor to cause the apparatus to determine an estimated input power of a wireless signal received at a first antenna element of a set of multiple antenna elements of the wireless device, determine an adjustment to a gain state of each amplifier of a set of multiple amplifiers of the wireless device based on the estimated input power satisfying a threshold, amplify a respective wireless signal of a set of multiple wireless signals received via a respective antenna element of the set of multiple antenna elements to generate set of multiple amplified signals based on the adjustment to the gain state, and perform an ADC on the set of multiple amplified signals to generate a set of multiple samples of the set of multiple wireless signals.

Another apparatus for wireless communication at a wireless device is described. The apparatus may include means for determining an estimated input power of a wireless signal received at a first antenna element of a set of multiple antenna elements of the wireless device, means for determining an adjustment to a gain state of each amplifier of a set of multiple amplifiers of the wireless device based on the estimated input power satisfying a threshold, means for amplifying a respective wireless signal of a set of multiple wireless signals received via a respective antenna element of the set of multiple antenna elements to generate set of multiple amplified signals based on the adjustment to the gain state, and means for performing an ADC on the set of multiple amplified signals to generate a set of multiple samples of the set of multiple wireless signals.

A non-transitory computer-readable medium storing code for wireless communication at a wireless device is described. The code may include instructions executable by a processor to determine an estimated input power of a wireless signal received at a first antenna element of a set of multiple antenna elements of the wireless device, determine an adjustment to a gain state of each amplifier of a set of multiple amplifiers of the wireless device based on the estimated input power satisfying a threshold, amplify a respective wireless signal of a set of multiple wireless signals received via a respective antenna element of the set of multiple antenna elements to generate set of multiple amplified signals based on the adjustment to the gain state, and perform an ADC on the set of multiple amplified signals to generate a set of multiple samples of the set of multiple wireless signals.

In some examples of the method, apparatuses, and non-transitory computer-readable medium described herein, each amplifier of the set of multiple amplifiers may have a set of multiple gain states and the method, apparatuses, and non-transitory computer-readable medium may include further operations, features, means, or instructions for selecting a first gain state from the set of multiple gain states to place the estimated input power within a dynamic range corresponding to the first gain state based on the adjustment to the gain state, where the set of multiple amplified signals may be generated using the first gain state.

In some examples of the method, apparatuses, and non-transitory computer-readable medium described herein, the adjustment to the gain state corresponds to an increase in a value of the gain state and the method, apparatuses, and non-transitory computer-readable medium may include further operations, features, means, or instructions for combining the adjustment to the gain state with an outer loop analog bias associated with each amplifier of the set of multiple amplifiers and adjusting the gain state of each amplifier of the set of multiple amplifiers in accordance with the combining.

In some examples of the method, apparatuses, and non-transitory computer-readable medium described herein, a value of the estimated input power of the wireless signal at the first antenna element differs from a value of the estimated input power of the wireless signal at a second antenna element of the set of multiple antenna elements within a threshold power value.

Some examples of the method, apparatuses, and non-transitory computer-readable medium described herein may further include operations, features, means, or instructions for generating the estimated input power at one or more radio frequency sensors associated with the first antenna element, where the estimated input power for the first antenna element represents an input power for each antenna element of the set of multiple antenna elements.

In some examples of the method, apparatuses, and non-transitory computer-readable medium described herein, the radio frequency sensor may be associated with each amplifier of the set of multiple amplifiers of the wireless device.

In some examples of the method, apparatuses, and non-transitory computer-readable medium described herein, the threshold includes a voltage saturation threshold associated with the ADC.

Some examples of the method, apparatuses, and non-transitory computer-readable medium described herein may further include operations, features, means, or instructions for outputting the set of multiple samples of the set of multiple wireless signals to a base band automatic gain controller of the wireless device.

Some examples of the method, apparatuses, and non-transitory computer-readable medium described herein may further include operations, features, means, or instructions for performing radio frequency band filtering on the set of multiple amplified signals to generate a set of multiple filtered amplified signals, where the ADC may be performed on the set of multiple filtered amplified signals.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level

DETAILED DESCRIPTION

Figure 1:
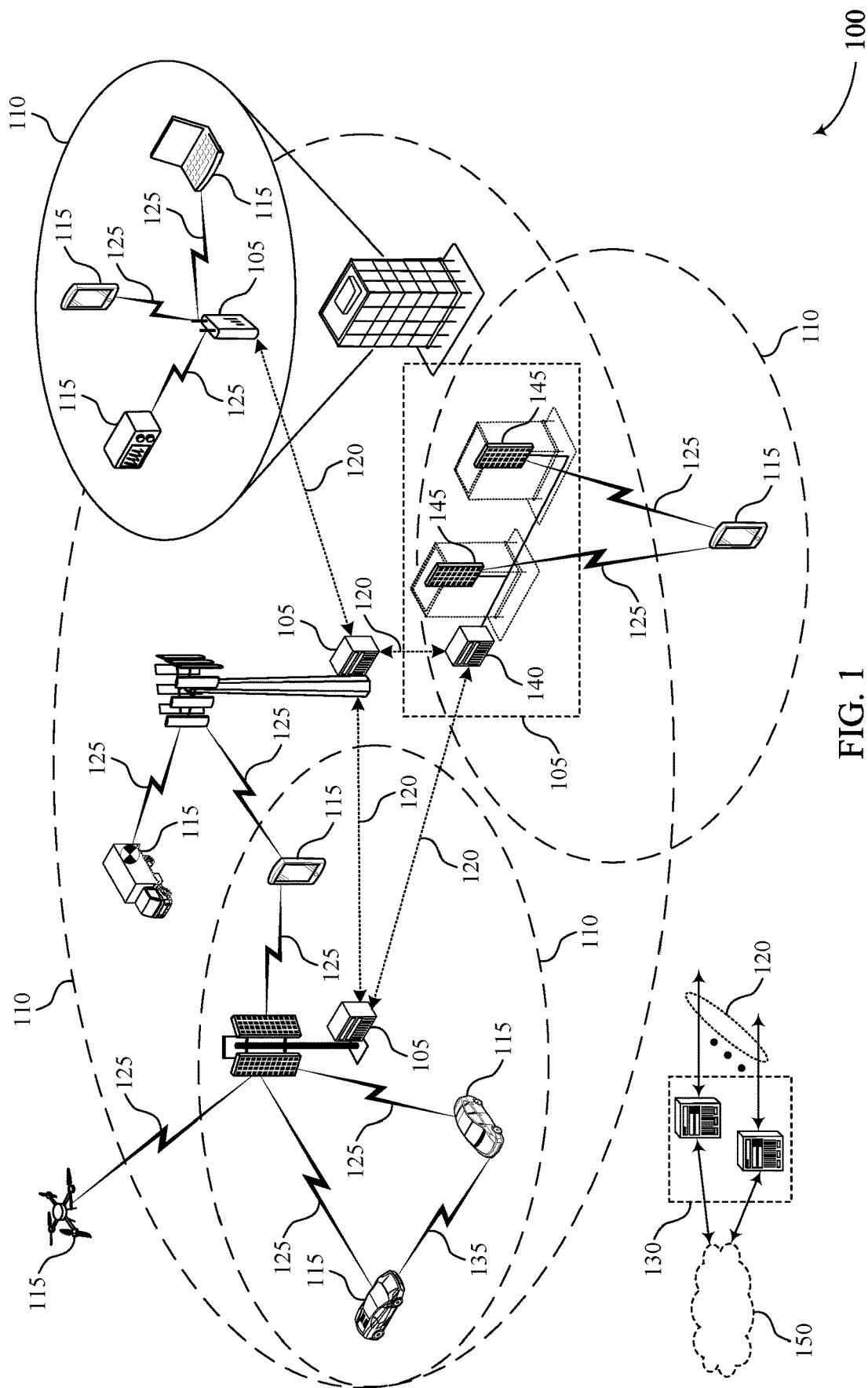
FIGS. 1 and 2 illustrate example wireless communications systems that support enhanced automatic gain control (AGC) for full-duplex in millimeter wave (mmW) systems in accordance with aspects of the present disclosure.

Some wireless communications systems (such as millimeter wave (mmW) or other high frequency systems) may support communications between devices with full duplex capabilities to reduce latency and to increase signaling throughput. For example, full duplex communications may increase throughput by increasing the volume of communications that may signaled at or by a device over a given duration over the same temporal and spectral resources of the wireless band. Full-duplex communications, however, are often affected by direct self-interference (DSI) or indirect self-interference (IDSI) strong self-interference imposed by the transmit antenna on the receive antenna within the same transceiver of a wireless device. In some cases, this self-interference may push the received signal outside of the dynamic range of a first analog to digital converter (ADC) of the device, thus causing clipping and other signal distortion for the received signal at the receiving wireless device. To reduce the likelihood of signal clipping without having to implement costly or complex processes (e.g., such as increasing the dynamic range) some devices may implement signal processing techniques to account for the self-interference.

In some examples, an additional signal processing path with a signal attenuator and second ADC may be added to a full-duplex capable device to identify and correct for possible signal clipping occurring at a main signal processing path. For example, in cases where the main signal would saturate the main ADC, the signal is attenuated, run through the second ADC, then amplified and compared to samples of the original signal processed by the first ADC (without attenuating). Then, the full-duplex capable device outputs whichever sample is greater (e.g., samples from the original signal or samples from the attenuated and amplified signal).

In some other examples, a second ADC of the wireless device may determine whether an input signal should be attenuated before being processed by the first ADC. For example, the second ADC may determine whether the input voltage level of the input signal would saturate the first ADC, and either passes the signal to an attenuator (if the voltage is high enough to saturate the first ADC) or passes the signal on to the second ADC without attenuation.

In some other examples, one or more RF sensors may be added to sense input power for low-noise amplifiers (LNA) associated with antenna elements of the wireless device. For example, the one or more RF sensors (e.g., a pre-LNA sensory) may perform a measurement for each LNA which translates to a bias which adjusts gain states of the LNAs or input power to the LNAs so that the outputted signal stays within the dynamic range of the ADC.

Aspects of the disclosure are initially described in the context of wireless communications systems. Aspects of the disclosure are further illustrated by and described with reference to apparatus diagrams, system diagrams, flowcharts, and digital front end configurations including dual ADC configurations and LNA configurations that relate to enhanced automatic gain control (AGC) for full-duplex in millimeter wave systems.

FIG. 1 illustrates an example of a wireless communications system 100 that supports enhanced AGC for full-duplex in millimeter wave systems in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

In some examples, one or more components of the wireless communications system 100 may operate as or be referred to as a network node. As used herein, a network node may refer to any UE 115, base station 105, entity of a core network 130, apparatus, device, or computing system configured to perform any techniques described herein. For example, a network node may be a UE 115. As another example, a network node may be a base station 105. As another example, a first network node may be configured to communicate with a second network node or a third network node. In one aspect of this example, the first network node may be a UE 115, the second network node may be a base station 105, and the third network node may be a UE 115. In another aspect of this example, the first network node may be a UE 115, the second network node may be a base station 105, and the third network node may be a base station 105. In yet other aspects of this example, the first, second, and third network nodes may be different. Similarly, reference to a UE 115, a base station 105, an apparatus, a device, or a computing system may include disclosure of the UE 115, base station 105, apparatus, device, or computing system being a network node. For example, disclosure that a UE 115 is configured to receive information from a base station 105 also discloses that a first network node is configured to receive information from a second network node. In this example, consistent with this disclosure, the first network node may refer to a first UE 115, a first base station 105, a first apparatus, a first device, or a first computing system configured to receive the information; and the second network node may refer to a second UE 115, a second base station 105, a second apparatus, a second device, or a second computing system.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORE-SET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

Some wireless communications devices such as UE 115 and base station 105 may be equipped with full duplex capabilities to reduce latency and to increase signaling throughput within wireless communications system 100. Full-duplex communications, however, are often subject to higher rates of interference such as DSI or IDSI imposed by the transmit antenna on the receive antenna within the same transceiver of a base station 105 or UE 115. In some cases, this interference may push a signal outside of the dynamic range of a first ADC of the front end of the device, thus clipping the signal and causing other signal distortions. To reduce the likelihood of signal clipping due to exceeding dynamic range, some devices may implement signal processing techniques to account for the self-interference.

In some examples, an additional signal processing path with a signal attenuator and second ADC may be added to a full-duplex capable device to identify and correct for possible signal clipping occurring at a main signal processing path. In some other examples, a second ADC of the wireless device may determine whether an input signal should be attenuated before being processed by the first ADC. For example, the second ADC may determine whether the input voltage level of the input signal would saturate the first ADC, and either passes the signal to an attenuator (if the voltage is high enough to saturate the first ADC) or passes the signal on to the second ADC without attenuation. In some other examples, one or more RF sensors may be added to sense input power for LNAs associated with antenna elements of a base station 105 or a UE 115. For example, the one or more RF sensors (e.g., a pre-LNA sensory) may perform a measurement for each LNA which translates to a bias which adjusts gain states of the LNAs or input power to the LNAs so that the outputted signal stays within the dynamic range of the ADC.

Figure 2:
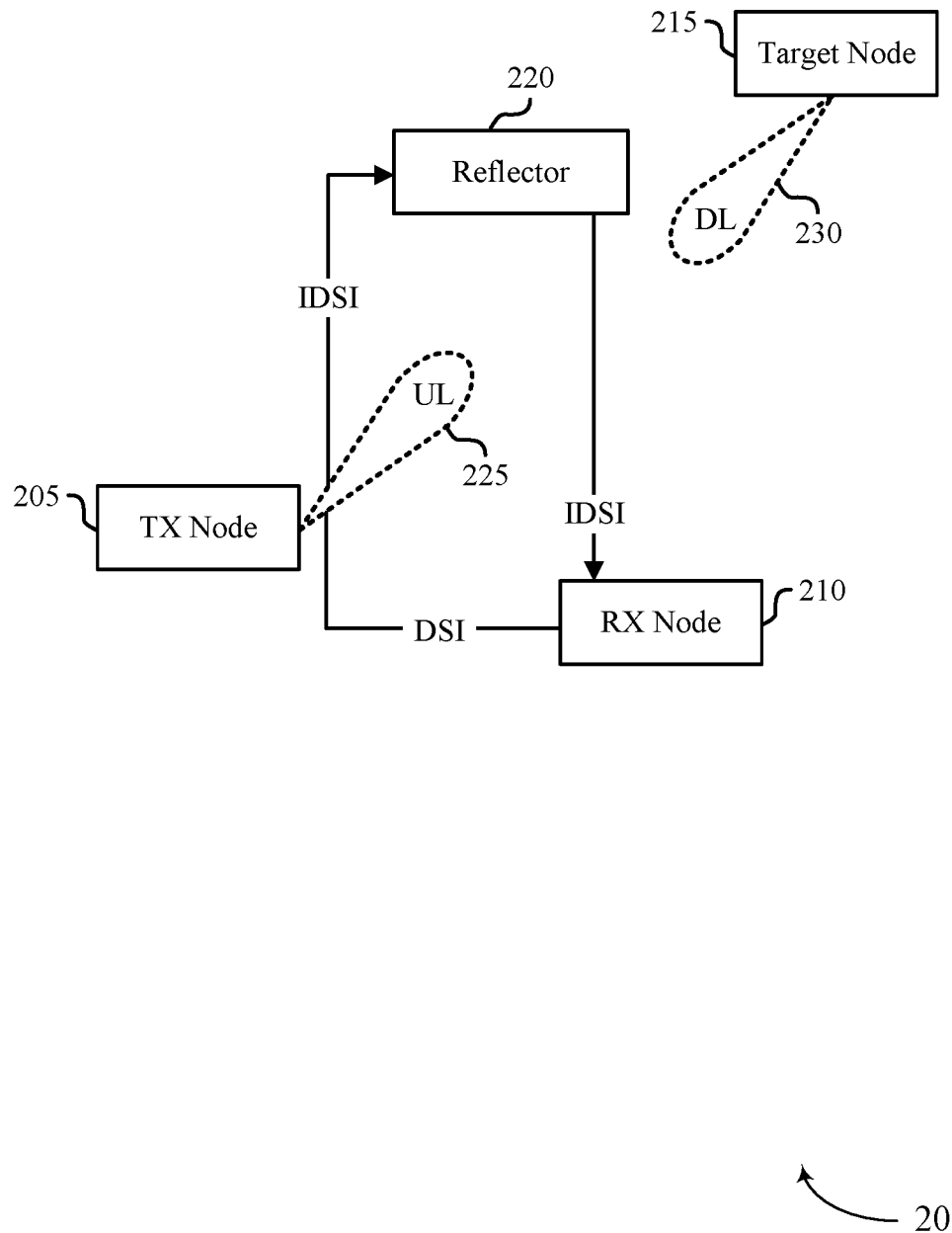

FIG. 2 illustrates an example of a wireless communications system 200 that supports enhanced AGC for full-duplex in millimeter wave systems in accordance with aspects of the present disclosure. In some examples, wireless communications system 200 may support communications between wireless nodes 205, 210, and 215, which may be examples of UEs 115, base stations 105, or any combination thereof described with reference to FIG. 1.

Some wireless communications systems (e.g., high frequency communications systems, FR2+) such as wireless communications system 200 may support full duplex communications between to reduce communications latency and to increase throughput. For example, in some cases, a target node 215 such as a base station may send downlink communications 230 to one node (e.g., a receiving node 210 such as a UE) while receiving uplink communications 225 from a transmitting node 205 at the same time. Such full duplex communications may reduce latency (especially for asymmetric links) by reducing the likelihood of potential uplink to downlink contention for devices. In some other cases, such as for integrated access backhaul (IAB) or repeater node-type devices, full duplex communications may reduce routing latency by using route selection algorithms that may activate adjacent hops simultaneously where an intermediate node operates in both downlink and uplink directions.

Full duplex communications may also increase system throughput by increasing the volume of communications that may occur at a device over a given duration. In some cases, full duplex capability may significantly increase throughput relative to throughputs associated with half-duplex communications or other non-full duplex capable devices, which may experience increased SNR as a cost for increasing throughput. For example, for value of SNR greater than 10 dB (e.g., SNR>>10 dB), increasing the throughput by a factor of m may correspond to an increase in SNR equal to $SNR^m$. For some high frequency bands (e.g., FR), however, SNR may be limited to a threshold value (e.g., ~30 dB) due to non-thermal impairments such as phase noise, PA non-linearity, FDRB, among other parameters. For example, increasing throughput by a factor of two (e.g., 64QAM to 4096QAM) may correspond to a reduction in noise floors by 20 dB, which may be impractical for high frequency (e.g., mmW) wireless links. In such cases, full duplex communications may increase throughput without such significant increases in SNR.

In some cases, full duplex capable devices may experience interference as a result of simultaneous uplink and downlink communications. Some examples of interference experienced by full duplex devices may include direct self-interference (DSI), in which a transmitting device generates distortion for its own receiver, and indirect self-interference (IDSI), in which the transmitting device (e.g., Tx node 205 or Rx node 210) generates distortion for its own receiver via a reflector device 220. Such cases of self-interference may be addressed by DSI may be reduced by device or antenna isolation, RF beamforming (RFBF), analog interference cancelation (AIC), digital interference cancelation (DIC), or any combination thereof.

In some examples, self-interference may be classified further by device mobility. For example, DSI may be static, which allows it to be modeled with high accuracy and for the associated RSSI to be accurately known. In some cases, the DSI may have higher RSSI than IDSI, however its influence is limited due to isolation and ability to mitigate it with AIC. IDSI has lower RSSI than DSI, however, due to mobile reflectors, it tends to be more dynamic (e.g., due to mobility and OTA channel). IDSI is characterized by RSSI and a non-linear model of the transmitter or a linear model of an over the air channel (e.g., to model the interference and estimated using a dedicated pilot). RSSI may be associated with inner AGC loops and outer AGC loops (e.g., to reduce LNA/ADC distortion or saturation). Since the nonlinear distortion of the LNA may not be fully mitigated by RFBF or direct interference cancelation, the RSSI may instead be used for interference mitigation in case of IDSI.

In some cases, the RSSI budget may be modified based on a given use cases, hardware of a device, or various environmental parameters. In some cases, systems may implement RFBF and direct interference cancelation. For example, direct interference cancelation may cancel leftovers of the RFBF to obtain a low noise level in the receiver analog. The RSSI budget (e.g., −19 dBc) may impact device components in different ways, for example, the LNA may absorb a direct hit, while the ADC may receive the noise-level leftovers post RFBF. In some examples, the RFBF may have a span of (∞: −12 dB), where the −12 dB occurs in cases that the reflector is in the same direction as the main signal, and ∞ means that it falls on its null, with the rest of the distortion directly affecting the ADC.

In some cases, the LNA may incur distortion relative to the main received signal (e.g., ~ 19 dBc distortion relative to the received signal at 60 dBc), which may prompt adjustments at the AGC outer loop to account for the distortion. Additionally or alternatively, the dynamic range of the ADC (for a UE operating in FR2 or other high frequency bands) may be ~56 dB, which in some cases may not fully capture the signal (e.g., in cases of high SNR without external interference or in cases that the interference is larger than the main received signal), causing signal distortions such as clipping of the main signal. In some cases, using an ADC with a higher dynamic range may reduce signal distortions, however, some such ADCs may consume more power and be relatively more expensive than ADCs having a lower dynamic range.

To account for signal distortions at the AGC outer loop LNA, adjustments may be made to the signal such that the signal at the input to the ADC is within the dynamic range (within a target dBFs). In some cases, however, the signal may change based on dynamic RFBF gain due to the mobility of the reflector 220, outer loop AGC imperfections (e.g., quantization errors, estimation errors), attempts to reduce fast LNA switching, among other variables. Thus in some examples, a wireless device may implement a number of different techniques to account for signal distortions.

As described herein, the self-interference may cause clipping and other signal distortion when the signal is received outside of the dynamic range. While increasing the dynamic range to account for the self-interference is possible, some other techniques may be implemented in device hardware to sense and mitigate the self-interference without increasing the dynamic range.

In some examples, an additional signal processing path with a signal attenuator and additional ADC may be added to a full-duplex capable device (e.g., wireless nodes 205, 215, or 210) to correct for possible signal clipping of a main signal processing path. For example, the signal is attenuated by a factor (e.g., c dB) such that the dynamic range of the second ADC is shifted or reduced relative to the dynamic range of the first ADC, run through the second ADC, then amplified to equalize the dynamic ranges and compared to samples of the original signal processed by the first ADC (without attenuating). Then, the full-duplex capable device outputs whichever sample is greater (samples from the original signal or samples from the attenuated and amplified signal).

In some other examples, a second ADC of the full-duplex capable device may determine whether an input signal should be attenuated before being processed by a first ADC. For example, the second ADC estimates whether the input voltage level of the input signal would saturate the first ADC, and either passes the signal to an attenuator (if the voltage is high enough to saturate the first ADC) or passes the signal on for further processing.

In some other examples, one or more RF sensors may be added to sense input power for LNA associated with antenna elements of the wireless device. For example, the RF sensor determines whether the input power of the signal would put the signal outside of a dynamic range, and then adjusts gain states of the LNAs so that the outputted signal stays within the dynamic range.

Figure 3:
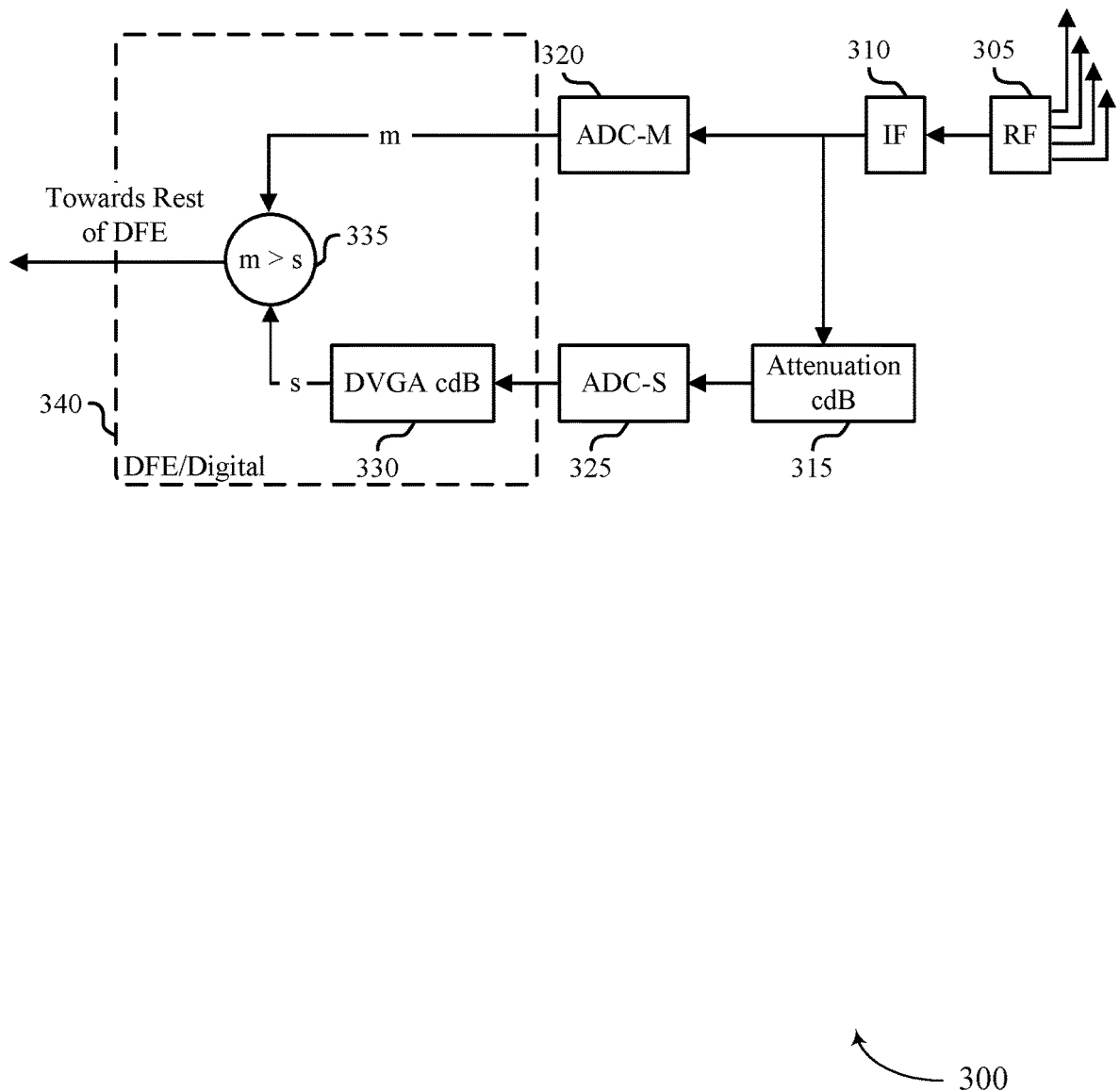
FIGS. 3 and 4 illustrate examples of dual analog to digital conversion (ADC) configurations that support enhanced AGC for full-duplex in millimeter wave systems in accordance with aspects of the present disclosure.

FIG. 3 illustrates an example of a dual ADC configuration 300 that supports enhanced AGC for full-duplex in millimeter wave systems in accordance with aspects of the present disclosure. The dual ADC configuration 300 may be implemented at or by a number of different wireless devices in a wireless communications system. For example, the dual ADC configuration 300 may be implemented by a base station or a UE such as the base stations 105 and UEs 115 described with reference to FIG. 1.

The dual ADC configuration 300 may include two ADCs for processing a wireless signal at a wireless device. In some cases that a static use case is applicable, the AGC outer loop may converge to the signal and distortion leftovers following the RFBF. In examples that a dynamic use case is applicable, a device may apply a double ADC approach and digital combining in the digital front end (DFE) of the device using a per sample decision. For example, a UE may select samples based on a threshold comparison of signals output by two separate ADCs used to process an incoming signal.

The wireless device may receive a signal at RF filter 305, which may output the signal to an intermediate frequency (IF) converter 310. In some cases, if the signal is affected by self-interference, the IF may send the signal to an attenuator 315, which may attenuate the signal to attempt to mitigate the effects of the self-interference. The attenuated signal may be sent to the secondary ADC (ADC-S) 325 which has the same dynamic range (DR) as main ADC (ADC-M) 325, however shifted or scaled (by a factor such as an the attenuation factor c dB in IF). The ADC-S 325 may send the attenuated samples to the digital variable gain amplifier (DVGA) 330 which amplifies the attenuated output of the ADC-S in the digital front end 335 (e.g., by "c" dB to reverse the attention of attenuator 315). The device may obtain samples "s," which include the samples of the signal attenuated, processed by the ADC-S 325, and amplified by the DVGA 330, and the device may obtain samples "m" which include samples of the original signal processed by the ADC-M 320. The device may perform digital combining between these two samples in the DFE 340 based on a threshold comparison of the two samples m and s at the comparator 335. For example, the threshold comparison may be used to determine which sample is greater (e.g., whether m>s or s>m), and the comparator may output the greater of the two samples. In the example of dual ADC configuration 300, the comparator may output m samples based on the comparison m>s at the comparator 335. In some examples, the device may perform the operations of dual ADC configuration 300 for in-phase and quadrature (I/Q) components of the signal independently (e.g., separately for I/Q portions of the signal).

The addition of the second signal processing path including the second ADC-S 325 may correct for possible signal clipping of a main signal processing path. For example, the main signal is attenuated by a certain amount (e.g., by "c" dB) to reduce interference effects, processed at the second ADC-S 325, then amplified and compared to samples of the original signal processed by the first ADC-M 320 (which is the original non-attenuated signal). Then, the DFE 340 device outputs whichever sample is greater. In either case, the device may not experience degradation of the original signal path (e.g., the "interference free" use case) which includes processing of the original signal th ADC-M 320, so the device may fall back to the baseline signal processing procedure in cases where the attenuation of the signal at the second signal processing path is not applicable, or in cases where self-interference is relatively small.

One example of dual ADC configuration 300 may be represented by the input and output values of Table 1, although a number of different input and output values are possible for dual ADC configuration 300.

TABLE 1

Dual ADC Configuration

| Dynamic Range | 0-1 |
|---|---|
| c (dB) | 10 |
| ADC-M in (V) | 2 |
| ADC-M out (Sample) | 1 |
| ADC-S in (V) | 2 |
| ADC-S out (Sample) | 0.2 |
| Comparator in M (Sample) | 1 |
| Comparator in S (Sample) | 2 |
| Out Sample (Sample) | 2 |

For example, the dynamic range of the ADC-M 320 may range from 0 to 1 dB, and the input voltage to the ADC-M 320 and ADC-S 325 may both be 2 V. The output of the ADC-M may be a sample value of 1, while the input voltage of ADC-S 325 may be attenuated such that the output of the ADC-S 325 may be a sample value of 0.2. The output of the ADC-S 325 may be amplified by DVGA 330 by a factor of c (such as the associated attenuation factor c dB) such that the input "s" of the ADC-S 325 to the comparator 340 has a sample value of 2, while the input "m" of the ADC-M 320 to the comparator 340 has a sample value of 1. The comparator then compares the inputs from ADC-M 320 to input from ADC-S 325 (e.g., 1<2) and outputs the 2 samples of ADC-S 325 because the sample number from ADC-S 325 is greater than the sample value from ADC-M 320.

In some other examples, instead of using two ADCs (e.g., ADC-M 320 and ADC-S 325) having dynamic ranges of ~56 dB, a device may implement a single ADC with a dynamic range large enough to account for the interference (e.g., by targeting the AGC to high dBFs). In some cases, however, the ADC with large dynamic range is applicable in terms of power consumption and area, but may be costly to implement as compared to the dual ADC configuration 300.

Figure 4:
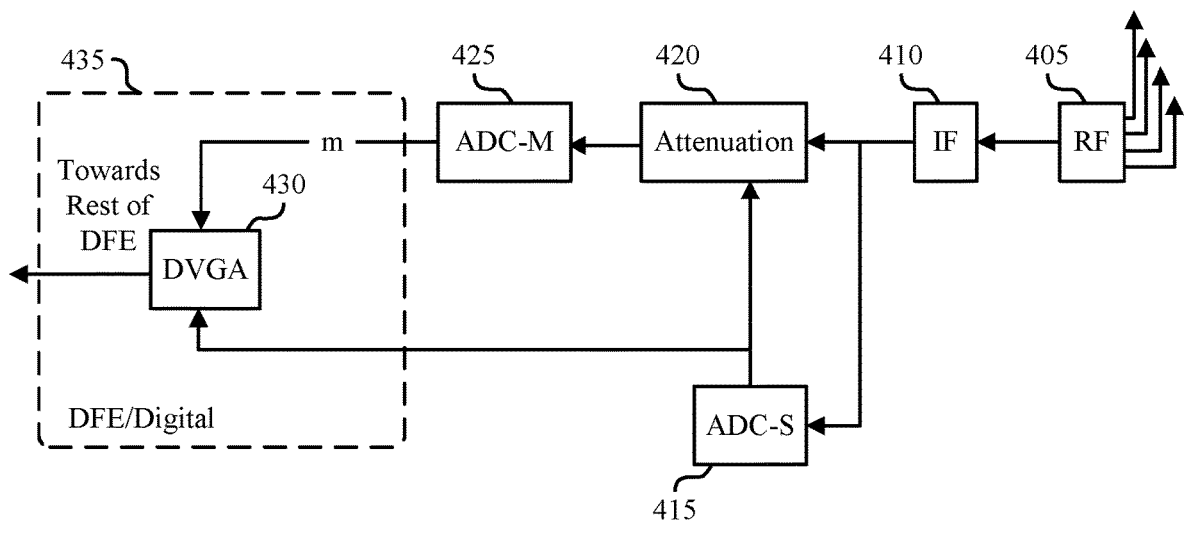

FIG. 4 illustrates an example of a dual ADC configuration 400 that supports enhanced AGC for full-duplex in millimeter wave systems in accordance with aspects of the present disclosure. The dual ADC configuration 400 may be implemented at or by a number of different wireless devices in a wireless communications system. For example, the dual ADC configuration 400 may be implemented by a base station or a UE such as the base stations 105 and UEs 115 described with reference to FIG. 1.

The dual ADC configuration 400 may be a fast ADC approach which includes two ADCs for processing a wireless signal. In such examples, the device may reduce the likelihood of ADC saturation by using a double ADC approach, with the AGC-S serving the purpose of analog AGC.

The wireless device may receive a signal at RF filter 405, which may output the signal to an IF converter 410, which is input to the ADC-S 415. At the input of signal, the ADC-S 415 may estimate the power of the signal during a configured time interval to determine whether the input power of the signal would saturate the ADC-M 425. In cases that the ADC-S 415 determines the input power would saturate the ADC-M, the ADC-S 415 may send the signal to the attenuator 420 to be attenuated (e.g., by a factor c dB), and the ADC-S 415 may send an indication to the DVGA 430 that the signal is to be attenuated. In some implementations, the power calculator included with the ADC-S 415 may port the value to the base band chip (e.g., part of the DFE), which may update the AGC process regarding the attenuation of the signal. The attenuated signal is then processed at the second ADC-M 425 and output as m samples to the DFE 435, and then is amplified by the DVGA 430. After amplifying the attenuated signal, the DVGA 430 outputs the amplified samples to the rest of the DFE.

In some examples, the dual ADC configuration 400 may implement synchronization between digital and analog components of the wireless device, as well as control components. In some cases, updates to the ADC-S may be controlled by the device modem of the UE, and the ADC-S 415 may use fewer bits than the ADC-M 425 because the ADC-S 415 estimates the approximate power of the incoming signal, while the ADC-M 425 is involved in additional signal processing procedures that use a larger number of bits to perform. In some cases, the AGC attenuation may be estimated using an AGC mechanism involving base band calculations, or by using other methods. In some examples, the device may estimate the power of the wireless signal during a configured time interval. In some examples, a device may receive control signaling which indicates the time interval which may be a dedicated multi-band (MB) symbol which may be used or reserved for performing the ACG attenuation. The time interval may be any other desired increment of time, including, a symbol, multiple symbol periods, a slot, a subframe, or the like.

The dual ADC configuration 400 may utilize the second ADC-S 415 to may determine whether the input signal should be attenuated before being processed by the first ADC-M 425, for example, in cases that the original input signal would saturate the ADC-M 425 or in cases where self-interference pushes the signal outside of the dynamic range supported by the ADC-M 425. The second ADC-S 415 estimates whether the input voltage level of the input signal would saturate the first ADC-M 425, and either passes the signal to the attenuator 420 (e.g., if the voltage is high enough to saturate the first ADC-M 425) or passes the signal on for further processing (e.g., if the voltage is low enough to remain within the dynamic range of the first ADC-M 425).

Figure 5:
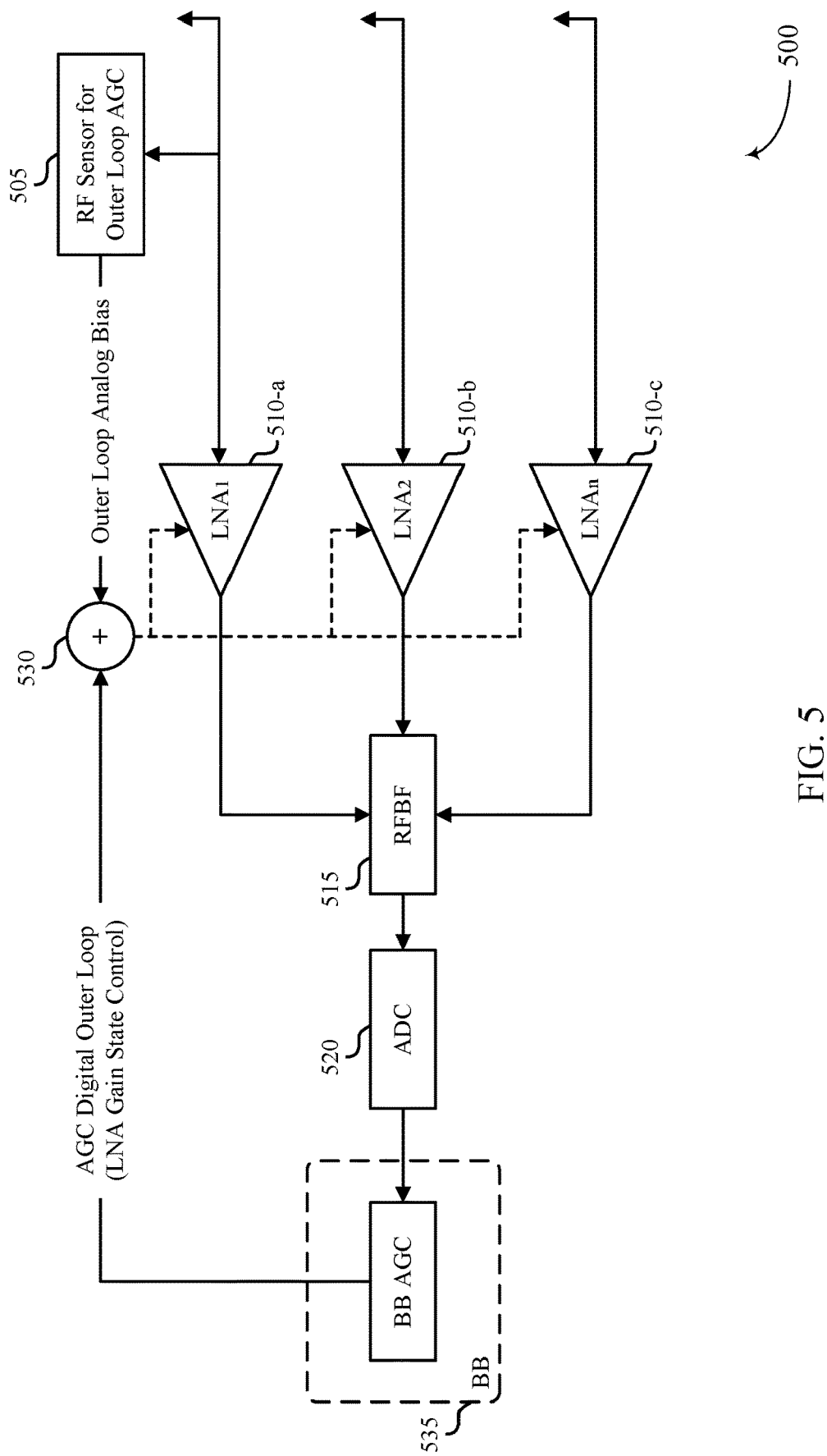
FIG. 5 illustrates an example of a low noise amplifier (LNA) configuration that supports enhanced AGC for full-duplex in millimeter wave systems in accordance with aspects of the present disclosure.

FIG. 5 illustrates an example of an LNA configuration 500 that supports enhanced AGC for full-duplex in millimeter wave systems in accordance with aspects of the present disclosure. The LNA configuration 500 may be implemented at or by a number of different wireless devices in a wireless communications system. For example, the LNA configuration 500 may be implemented by a base station or a UE such as the base stations 105 and UEs 115 described with reference to FIG. 1.

The LNA configuration 500 may include a number of components for processing a wireless signal at a receive antenna array of a wireless device. In some cases that a static use case is applicable, the AGC outer loop may converge to the signal and distortion leftovers, and even when the dynamic range is ~−19 dBc, the updated LNA state may prevent high LNA noise levels, ADC clipping, or both. Such implementations may have increased noise floor, but may effectively account for signal distortions. In examples that a dynamic use case is applicable, a device may apply analog outer loop AGC techniques (which may have fewer steps relative to static use case approaches).

In some high frequency systems (such as those supporting mmW bands including FR2, FR2X, and FR4 bands) a device may receive a signal having similar power (e.g., RSSI) on each receiving antenna. Based on the relatively similar power at each antenna element, one or more analog power measurement sensors 505 (e.g., an RF sensor or pre-LNA sensor 505) may be placed at one of, or a few of, the antenna elements (e.g., the LNA input), and the measurement output by these one or more power measurement sensors 505 may represent a measurement used for "fast AGC", which affects some or all of antenna elements of the array. Because the RSSI for all the elements in the array is expected to be similar, the number of sensors may be decimated or a single sensor may be used on one of the inputs to reduce device cost and complexity. When the measurement is performed, this measurement may be translated to a bias value (e.g., a value of extra LNA states, or a power value), and combined with a command coming from the outer AGC loop mechanism, that controls the LNA state for all the antenna elements. For example, the LNA state may control the amount of signal amplification applied by an LNA 510 (based on the value of the RF sensor), and the state may be adjusted so that the received signal is amplified by the LNA 510 to be within a dynamic range of the ADC 520 to reduce the likelihood of signal clipping by the ADC 520.

In some examples, the one or more RF sensors 505 may sense an input power for the LNAs 510-a, 510-b, and 510-c associated with each antenna element of the wireless device. In some cases, the one or more RF sensors 505 may determine whether the input power of the signal would put the signal outside of a dynamic range, or if the signal would saturate the ADC 520, and then may adjust gain states of the LNAs 510 so that the outputted signal stays within the dynamic range and does not saturate the ADC 520. The device combines the bias value with a signal from the outer loop analog bias at 530, and sends the signal to the LNAs 510. The LNAs 510 may send respective signaling to the RFBF 515, which may forward the signal to the ADC 520 and the base band AGC 535. Based on adjusting the LNA states, interference may be mitigated, and signal clipping may be addressed directly at the receiving antenna array of the wireless device. For example, the device may determine to reduce the LNA gain states based on determining that the input power would be above an input power threshold (e.g., an input threshold for the ADC 520). Then, the device may adjust the gain states of the LNAs such that the collective output of the LNAs are below the input power threshold to reduce the likelihood that the signal is clipped by the ADC 520.

Figure 6:
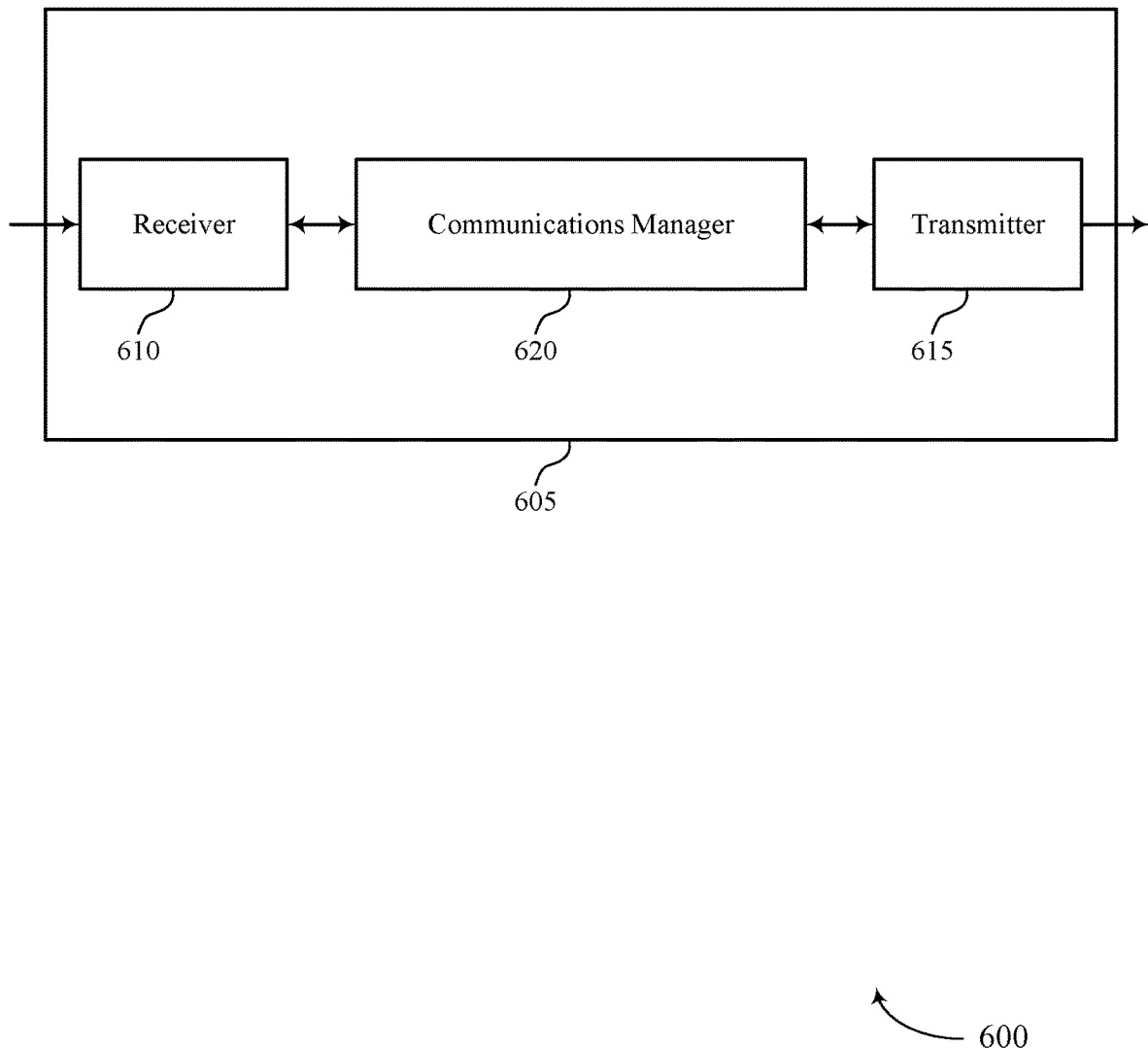
FIGS. 6 and 7 show block diagrams of devices that support enhanced AGC for full-duplex in millimeter wave systems in accordance with aspects of the present disclosure.

FIG. 6 shows a block diagram 600 of a device 605 that supports enhanced AGC for full-duplex in millimeter wave systems in accordance with aspects of the present disclosure. The device 605 may be an example of aspects of a UE 115 or a base station 105 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to enhanced AGC for full-duplex in millimeter wave systems). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to enhanced AGC for full-duplex in millimeter wave systems). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of enhanced AGC for full-duplex in millimeter wave systems as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 620 may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communication at a wireless device in accordance with examples as disclosed herein. For example, the communications manager 620 may be configured as or otherwise support a means for performing a first analog to digital conversion of a wireless signal corresponding to a dynamic range to generate a first sample of the wireless signal. The communications manager 620 may be configured as or otherwise support a means for attenuating the wireless signal by a factor to generate an attenuated wireless signal. The communications manager 620 may be configured as or otherwise support a means for performing a second analog to digital conversion on the attenuated wireless signal corresponding to the dynamic range to generate a second sample of the attenuated wireless signal. The communications manager 620 may be configured as or otherwise support a means for amplifying the second sample by the factor. The communications manager 620 may be configured as or otherwise support a means for outputting one of the first sample or the second sample.

Additionally or alternatively, the communications manager 620 may support wireless communication at a wireless device in accordance with examples as disclosed herein. For example, the communications manager 620 may be configured as or otherwise support a means for performing a first analog to digital conversion of a wireless signal to determine an estimated power of the wireless signal. The communications manager 620 may be configured as or otherwise support a means for attenuating the wireless signal by a factor to generate an attenuated wireless signal based on the estimated power satisfying a threshold. The communications manager 620 may be configured as or otherwise support a means for performing a second analog to digital conversion on the attenuated wireless signal to generate a sample of the attenuated wireless signal. The communications manager 620 may be configured as or otherwise support a means for amplifying the sample by the factor based on the estimated power satisfying the threshold. The communications manager 620 may be configured as or otherwise support a means for outputting the sample.

Additionally or alternatively, the communications manager 620 may support wireless communication at a wireless device in accordance with examples as disclosed herein. For example, the communications manager 620 may be configured as or otherwise support a means for determining an estimated input power of a wireless signal received at a first antenna element of a set of multiple antenna elements of the wireless device. The communications manager 620 may be configured as or otherwise support a means for determining an adjustment to a gain state of each amplifier of a set of multiple amplifiers of the wireless device based on the estimated input power satisfying a threshold. The communications manager 620 may be configured as or otherwise support a means for amplifying a respective wireless signal of a set of multiple wireless signals received via a respective antenna element of the set of multiple antenna elements to generate set of multiple amplified signals based on the adjustment to the gain state. The communications manager 620 may be configured as or otherwise support a means for performing an analog to digital conversion on the set of multiple amplified signals to generate a set of multiple samples of the set of multiple wireless signals.

By including or configuring the communications manager 620 in accordance with examples as described herein, the device 605 (e.g., a processor controlling or otherwise coupled to the receiver 610, the transmitter 615, the communications manager 620, or a combination thereof) may support techniques for more efficient signal processing, reduced self-interference impacts, and increased device throughput.

Figure 7:
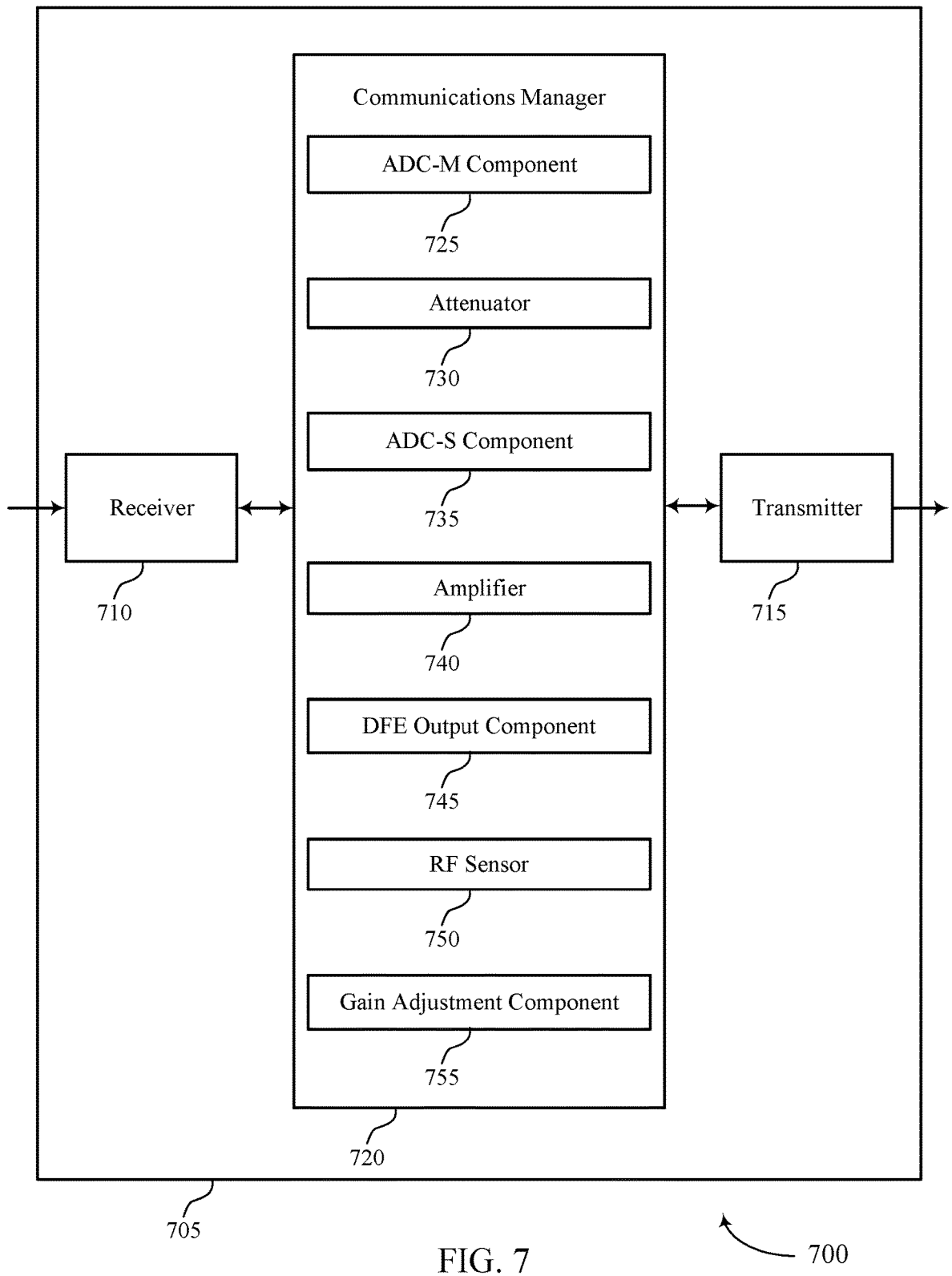

FIG. 7 shows a block diagram 700 of a device 705 that supports enhanced AGC for full-duplex in millimeter wave systems in accordance with aspects of the present disclosure. The device 705 may be an example of aspects of a device 605, a UE 115, or a base station 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to enhanced AGC for full-duplex in millimeter wave systems). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to enhanced AGC for full-duplex in millimeter wave systems). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of enhanced AGC for full-duplex in millimeter wave systems as described herein. For example, the communications manager 720 may include an ADC-M component 725, an attenuator 730, an ADC-S component 735, an amplifier 740, a DFE output component 745, an RF sensor 750, a gain adjustment component 755, or any combination thereof. The communications manager 720 may be an example of aspects of a communications manager 620 as described herein. In some examples, the communications manager 720, or various components thereof, may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communication at a wireless device in accordance with examples as disclosed herein. The ADC-M component 725 may be configured as or otherwise support a means for performing a first analog to digital conversion of a wireless signal corresponding to a dynamic range to generate a first sample of the wireless signal. The attenuator 730 may be configured as or otherwise support a means for attenuating the wireless signal by a factor to generate an attenuated wireless signal. The ADC-S component 735 may be configured as or otherwise support a means for performing a second analog to digital conversion on the attenuated wireless signal corresponding to the dynamic range to generate a second sample of the attenuated wireless signal. The amplifier 740 may be configured as or otherwise support a means for amplifying the second sample by the factor. The DFE output component 745 may be configured as or otherwise support a means for outputting one of the first sample or the second sample.

Additionally or alternatively, the communications manager 720 may support wireless communication at a wireless device in accordance with examples as disclosed herein. The ADC-S component 735 may be configured as or otherwise support a means for performing a first analog to digital conversion of a wireless signal to determine an estimated power of the wireless signal. The attenuator 730 may be configured as or otherwise support a means for attenuating the wireless signal by a factor to generate an attenuated wireless signal based on the estimated power satisfying a threshold. The ADC-M component 725 may be configured as or otherwise support a means for performing a second analog to digital conversion on the attenuated wireless signal to generate a sample of the attenuated wireless signal. The amplifier 740 may be configured as or otherwise support a means for amplifying the sample by the factor based on the estimated power satisfying the threshold. The DFE output component 745 may be configured as or otherwise support a means for outputting the sample.

Additionally or alternatively, the communications manager 720 may support wireless communication at a wireless device in accordance with examples as disclosed herein. The RF sensor 750 may be configured as or otherwise support a means for determining an estimated input power of a wireless signal received at a first antenna element of a set of multiple antenna elements of the wireless device. The gain adjustment component 755 may be configured as or otherwise support a means for determining an adjustment to a gain state of each amplifier of a set of multiple amplifiers of the wireless device based on the estimated input power satisfying a threshold. The amplifier 740 may be configured as or otherwise support a means for amplifying a respective wireless signal of a set of multiple wireless signals received via a respective antenna element of the set of multiple antenna elements to generate set of multiple amplified signals based on the adjustment to the gain state. The ADC-M component 725 may be configured as or otherwise support a means for performing an analog to digital conversion on the set of multiple amplified signals to generate a set of multiple samples of the set of multiple wireless signals.

Figure 8:
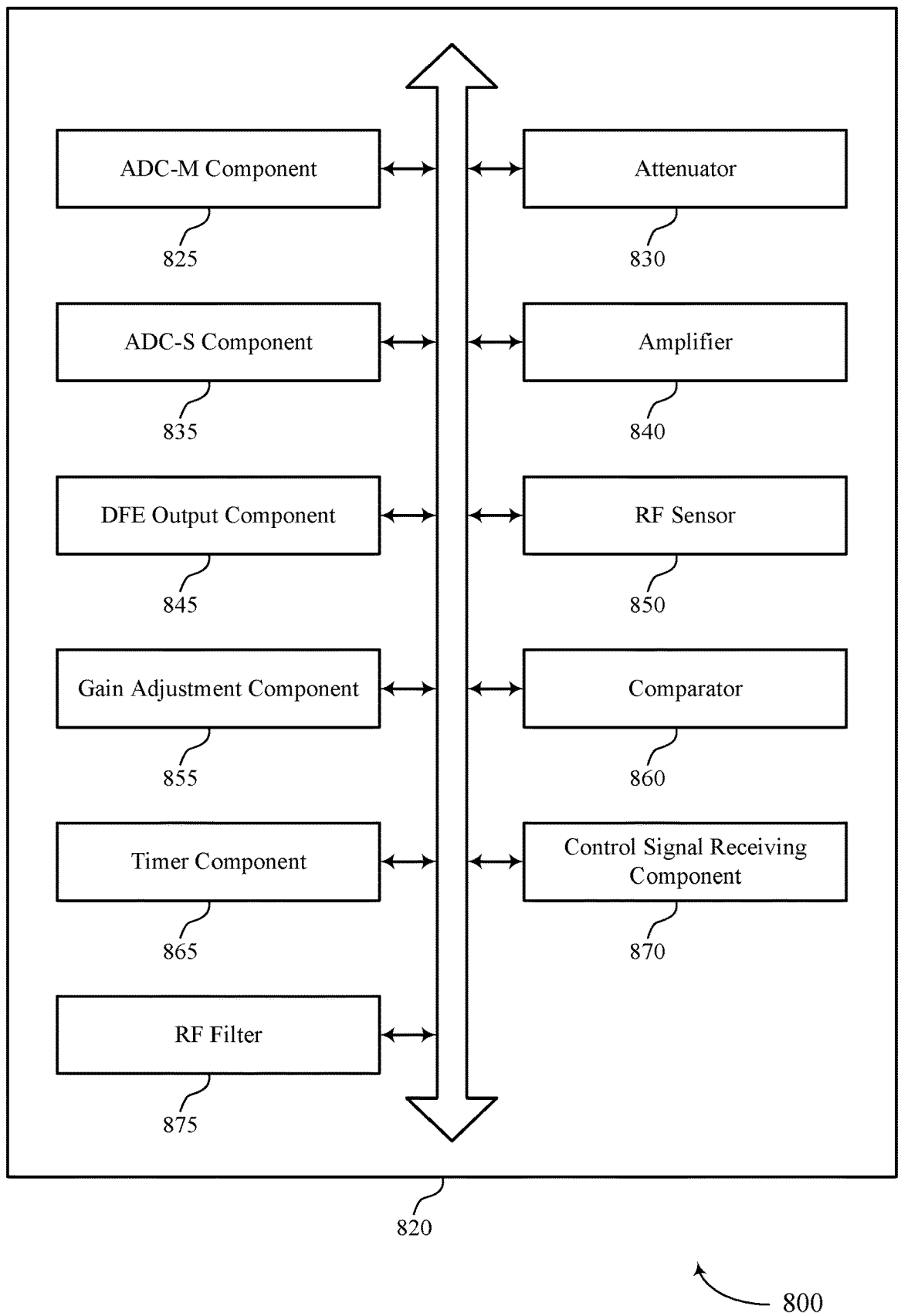
FIG. 8 shows a block diagram of a communications manager that supports enhanced AGC for full-duplex in millimeter wave systems in accordance with aspects of the present disclosure.

FIG. 8 shows a block diagram 800 of a communications manager 820 that supports enhanced AGC for full-duplex in millimeter wave systems in accordance with aspects of the present disclosure. The communications manager 820 may be an example of aspects of a communications manager 620, a communications manager 720, or both, as described herein. The communications manager 820, or various components thereof, may be an example of means for performing various aspects of enhanced AGC for full-duplex in millimeter wave systems as described herein. For example, the communications manager 820 may include an ADC-M component 825, an attenuator 830, an ADC-S component 835, an amplifier 840, a DFE output component 845, an RF sensor 850, a gain adjustment component 855, a comparator 860, a timer component 865, a control signal receiving component 870, an RF filter 875, or any combination thereof. Each of these components may communicate, directly or indirectly, with one another (e.g., via one or more buses).

The communications manager 820 may support wireless communication at a wireless device in accordance with examples as disclosed herein. The ADC-M component 825 may be configured as or otherwise support a means for performing a first analog to digital conversion of a wireless signal corresponding to a dynamic range to generate a first sample of the wireless signal. The attenuator 830 may be configured as or otherwise support a means for attenuating the wireless signal by a factor to generate an attenuated wireless signal. The ADC-S component 835 may be configured as or otherwise support a means for performing a second analog to digital conversion on the attenuated wireless signal corresponding to the dynamic range to generate a second sample of the attenuated wireless signal. The amplifier 840 may be configured as or otherwise support a means for amplifying the second sample by the factor. The DFE output component 845 may be configured as or otherwise support a means for outputting one of the first sample or the second sample.

In some examples, to support outputting one of the first sample or the second sample, the comparator 860 may be configured as or otherwise support a means for outputting a greater of the first sample or the second sample based on a comparison of the first sample and the second sample.

In some examples, the dynamic range corresponding to the second analog to digital conversion is shifted or scaled relative to the dynamic range corresponding to the first analog to digital conversion based on the attenuating, and the amplifier 840 may be configured as or otherwise support a means for amplifying the second sample to equalize or scale the dynamic range corresponding to the first analog to digital conversion and the second analog to digital conversion.

In some examples, the factor corresponds to a number of decibels for attenuating the wireless signal and for amplifying the second sample.

In some examples, the first analog to digital conversion includes a main analog to digital conversion and the second analog to digital conversion includes a secondary analog to digital conversion.

In some examples, the wireless signal includes an in-phase signal, a quadrature signal, or both.

Additionally or alternatively, the communications manager 820 may support wireless communication at a wireless device in accordance with examples as disclosed herein. In some examples, the ADC-S component 835 may be configured as or otherwise support a means for performing a first analog to digital conversion of a wireless signal to determine an estimated power of the wireless signal. In some examples, the attenuator 830 may be configured as or otherwise support a means for attenuating the wireless signal by a factor to generate an attenuated wireless signal based on the estimated power satisfying a threshold. In some examples, the ADC-M component 825 may be configured as or otherwise support a means for performing a second analog to digital conversion on the attenuated wireless signal to generate a sample of the attenuated wireless signal. In some examples, the amplifier 840 may be configured as or otherwise support a means for amplifying the sample by the factor based on the estimated power satisfying the threshold. In some examples, the DFE output component 845 may be configured as or otherwise support a means for outputting the sample.

In some examples, the timer component 865 may be configured as or otherwise support a means for identifying a time interval to monitor for determining the estimated power of the wireless signal, where the first analog to digital conversion is performed on the wireless signal during the time interval.

In some examples, the control signal receiving component 870 may be configured as or otherwise support a means for receiving control signaling indicating a time interval to monitor for determining the estimated power of the wireless signal, where the first analog to digital conversion is performed on the wireless signal during the time interval.

In some examples, the threshold includes a voltage saturation threshold associated with the first analog to digital conversion.

In some examples, a number of bits for the estimated power determined by the first analog to digital conversion is fewer than a number of bits included by the first analog to digital conversion in the sample of the attenuated wireless signal.

In some examples, the DFE output component 845 may be configured as or otherwise support a means for outputting, to a baseband processor of the wireless device, a value of the estimated power of the wireless signal based on attenuating the wireless signal.

In some examples, the factor includes a number of decibels for attenuating the wireless signal and for amplifying the sample.

In some examples, the first analog to digital conversion includes a main analog to digital conversion and the second analog to digital conversion includes a secondary analog to digital conversion.

Additionally or alternatively, the communications manager 820 may support wireless communication at a wireless device in accordance with examples as disclosed herein. The RF sensor 850 may be configured as or otherwise support a means for determining an estimated input power of a wireless signal received at a first antenna element of a set of multiple antenna elements of the wireless device. The gain adjustment component 855 may be configured as or otherwise support a means for determining an adjustment to a gain state of each amplifier of a set of multiple amplifiers of the wireless device based on the estimated input power satisfying a threshold. In some examples, the amplifier 840 may be configured as or otherwise support a means for amplifying a respective wireless signal of a set of multiple wireless signals received via a respective antenna element of the set of multiple antenna elements to generate set of multiple amplified signals based on the adjustment to the gain state. In some examples, the ADC-M component 825 may be configured as or otherwise support a means for performing an analog to digital conversion on the set of multiple amplified signals to generate a set of multiple samples of the set of multiple wireless signals.

In some examples, each amplifier of the set of multiple amplifiers has a set of multiple gain states, and the gain adjustment component 855 may be configured as or otherwise support a means for selecting a first gain state from the set of multiple gain states to place the estimated input power within a dynamic range corresponding to the first gain state based on the adjustment to the gain state, where the set of multiple amplified signals are generated using the first gain state.

In some examples, the adjustment to the gain state corresponds to an increase in a value of the gain state, and the gain adjustment component 855 may be configured as or otherwise support a means for combining the adjustment to the gain state with an outer loop analog bias associated with each amplifier of the set of multiple amplifiers. In some examples, the adjustment to the gain state corresponds to an increase in a value of the gain state, and the gain adjustment component 855 may be configured as or otherwise support a means for adjusting the gain state of each amplifier of the set of multiple amplifiers in accordance with the combining.

In some examples, a value of the estimated input power of the wireless signal at the first antenna element differs from a value of the estimated input power of the wireless signal at a second antenna element of the set of multiple antenna elements within a threshold power value.

In some examples, the RF sensor 850 may be configured as or otherwise support a means for generating the estimated input power at one or more radio frequency sensors associated with the first antenna element, where the estimated input power for the first antenna element represents an input power for each antenna element of the set of multiple antenna elements.

In some examples, the one or more radio frequency sensors are associated with each amplifier of the set of multiple amplifiers of the wireless device.

In some examples, the threshold includes a voltage saturation threshold associated with the analog to digital conversion.

In some examples, the DFE output component 845 may be configured as or otherwise support a means for outputting the set of multiple samples of the set of multiple wireless signals to a base band AGC of the wireless device.

In some examples, the RF filter 875 may be configured as or otherwise support a means for performing radio frequency band filtering on the set of multiple amplified signals to generate a set of multiple filtered amplified signals, where the analog to digital conversion is performed on the set of multiple filtered amplified signals.

Figure 9:
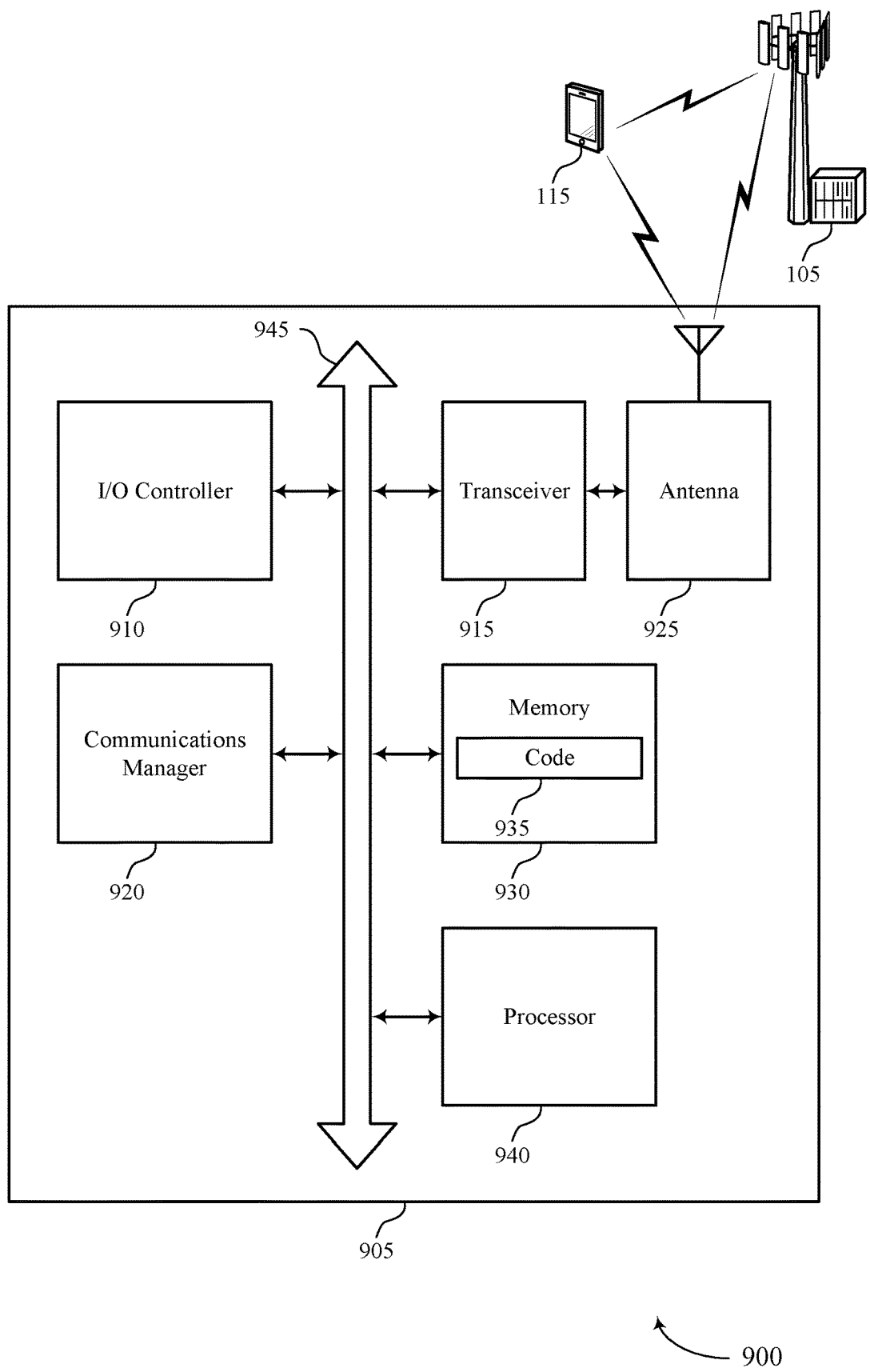
FIG. 9 shows a diagram of a system including a base station that supports enhanced AGC for full-duplex in millimeter wave systems in accordance with aspects of the present disclosure.

FIG. 9 shows a diagram of a system 900 including a device 905 that supports enhanced AGC for full-duplex in millimeter wave systems in accordance with aspects of the present disclosure. The device 905 may be an example of or include the components of a device 605, a device 705, or a UE 115 as described herein. The device 905 may communicate wirelessly with one or more base stations 105, UEs 115, or any combination thereof. The device 905 may include components for bi-directional voice and data communications including components for transmitting and receiving communications, such as a communications manager 920, an input/output (I/O) controller 910, a transceiver 915, an antenna 925, a memory 930, code 935, and a processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally or alternatively, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic I/O system (BIOS) which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting enhanced AGC for full-duplex in millimeter wave systems). For example, the device 905 or a component of the device 905 may include a processor 940 and memory 930 coupled with or to the processor 940, the processor 940 and memory 930 configured to perform various functions described herein.

The communications manager 920 may support wireless communication at a wireless device in accordance with examples as disclosed herein. For example, the communications manager 920 may be configured as or otherwise support a means for performing a first analog to digital conversion of a wireless signal corresponding to a dynamic range to generate a first sample of the wireless signal. The communications manager 920 may be configured as or otherwise support a means for attenuating the wireless signal by a factor to generate an attenuated wireless signal. The communications manager 920 may be configured as or otherwise support a means for performing a second analog to digital conversion on the attenuated wireless signal corresponding to the dynamic range to generate a second sample of the attenuated wireless signal. The communications manager 920 may be configured as or otherwise support a means for amplifying the second sample by the factor. The communications manager 920 may be configured as or otherwise support a means for outputting one of the first sample or the second sample.

Additionally or alternatively, the communications manager 920 may support wireless communication at a wireless device in accordance with examples as disclosed herein. For example, the communications manager 920 may be configured as or otherwise support a means for performing a first analog to digital conversion of a wireless signal to determine an estimated power of the wireless signal. The communications manager 920 may be configured as or otherwise support a means for attenuating the wireless signal by a factor to generate an attenuated wireless signal based on the estimated power satisfying a threshold. The communications manager 920 may be configured as or otherwise support a means for performing a second analog to digital conversion on the attenuated wireless signal to generate a sample of the attenuated wireless signal. The communications manager 920 may be configured as or otherwise support a means for amplifying the sample by the factor based on the estimated power satisfying the threshold. The communications manager 920 may be configured as or otherwise support a means for outputting the sample.

Additionally or alternatively, the communications manager 920 may support wireless communication at a wireless device in accordance with examples as disclosed herein. For example, the communications manager 920 may be configured as or otherwise support a means for determining an estimated input power of a wireless signal received at a first antenna element of a set of multiple antenna elements of the wireless device. The communications manager 920 may be configured as or otherwise support a means for determining an adjustment to a gain state of each amplifier of a set of multiple amplifiers of the wireless device based on the estimated input power satisfying a threshold. The communications manager 920 may be configured as or otherwise support a means for amplifying a respective wireless signal of a set of multiple wireless signals received via a respective antenna element of the set of multiple antenna elements to generate set of multiple amplified signals based on the adjustment to the gain state. The communications manager 920 may be configured as or otherwise support a means for performing an analog to digital conversion on the set of multiple amplified signals to generate a set of multiple samples of the set of multiple wireless signals.

By including or configuring the communications manager 920 in accordance with examples as described herein, the device 905 may support techniques for improved communication reliability, reduced latency, improved utilization of processing capability, increased device throughput, reduced signal clipping, reduced signal distortion, increased efficiency for full-duplex communications.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of enhanced AGC for full-duplex in millimeter wave systems as described herein, or the processor 940 and the memory 930 may be otherwise configured to perform or support such operations.

Figure 10:
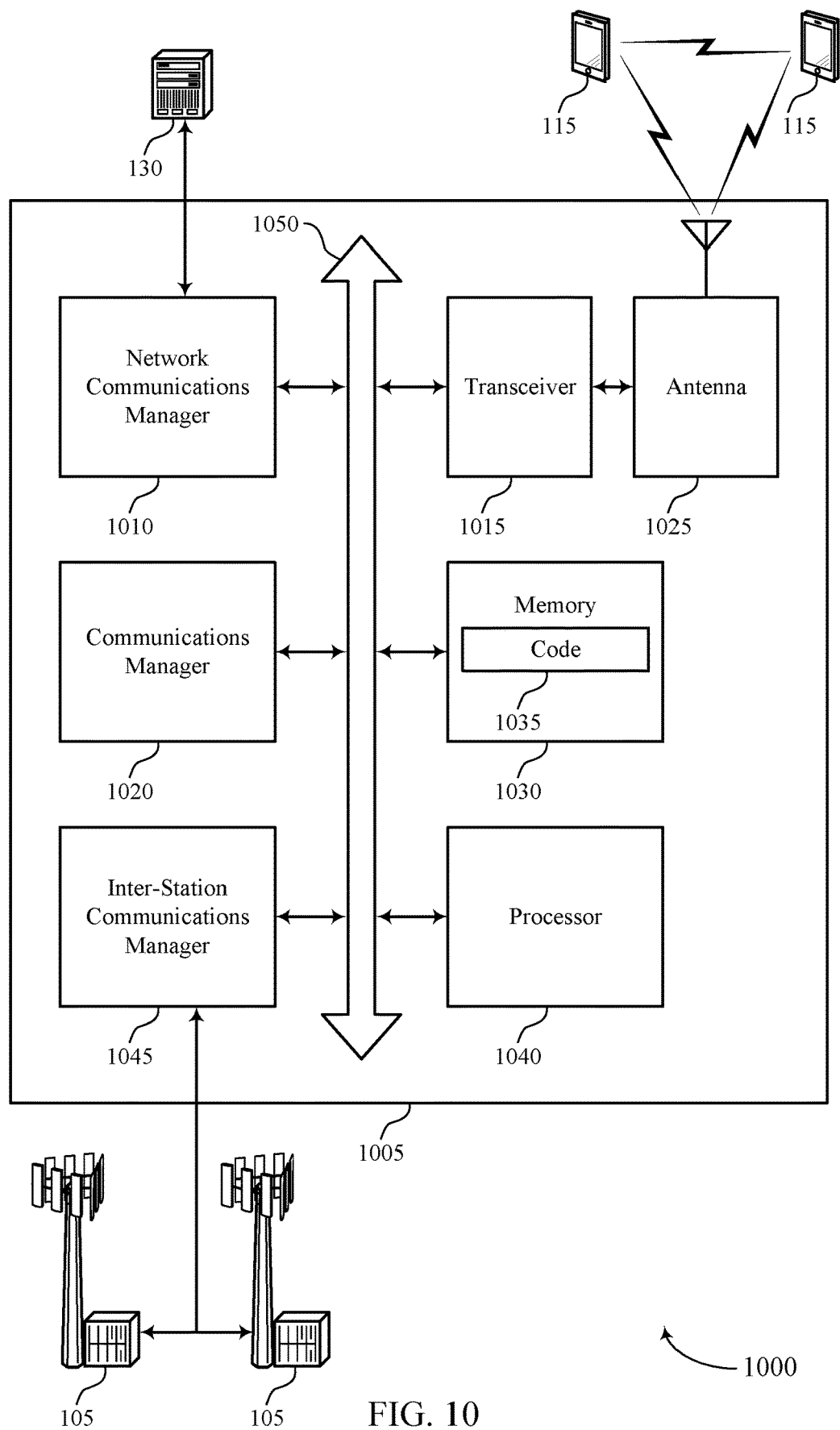
FIG. 10 shows a diagram of a system including a UE that supports enhanced AGC for full-duplex in millimeter wave systems in accordance with aspects of the present disclosure.

FIG. 10 shows a diagram of a system 1000 including a device 1005 that supports enhanced AGC for full-duplex in millimeter wave systems in accordance with aspects of the present disclosure. The device 1005 may be an example of or include the components of a device 605, a device 705, or a base station 105 as described herein. The device 1005 may communicate wirelessly with one or more base stations 105, UEs 115, or any combination thereof. The device 1005 may include components for bi-directional voice and data communications including components for transmitting and receiving communications, such as a communications manager 1020, a network communications manager 1010, a transceiver 1015, an antenna 1025, a memory 1030, code 1035, a processor 1040, and an inter-station communications manager 1045. These components may be in electronic communication or otherwise coupled (e.g., operatively, communicatively, functionally, electronically, electrically) via one or more buses (e.g., a bus 1050).

The network communications manager 1010 may manage communications with a core network 130 (e.g., via one or more wired backhaul links). For example, the network communications manager 1010 may manage the transfer of data communications for client devices, such as one or more UEs 115.

In some cases, the device 1005 may include a single antenna 1025. However, in some other cases the device 1005 may have more than one antenna 1025, which may be capable of concurrently transmitting or receiving multiple wireless transmissions. The transceiver 1015 may communicate bi-directionally, via the one or more antennas 1025, wired, or wireless links as described herein. For example, the transceiver 1015 may represent a wireless transceiver and may communicate bi-directionally with another wireless transceiver. The transceiver 1015 may also include a modem to modulate the packets, to provide the modulated packets to one or more antennas 1025 for transmission, and to demodulate packets received from the one or more antennas 1025. The transceiver 1015, or the transceiver 1015 and one or more antennas 1025, may be an example of a transmitter 615, a transmitter 715, a receiver 610, a receiver 710, or any combination thereof or component thereof, as described herein.

The memory 1030 may include RAM and ROM. The memory 1030 may store computer-readable, computer-executable code 1035 including instructions that, when executed by the processor 1040, cause the device 1005 to perform various functions described herein. The code 1035 may be stored in a non-transitory computer-readable medium such as system memory or another type of memory. In some cases, the code 1035 may not be directly executable by the processor 1040 but may cause a computer (e.g., when compiled and executed) to perform functions described herein. In some cases, the memory 1030 may contain, among other things, a BIOS which may control basic hardware or software operation such as the interaction with peripheral components or devices.

The processor 1040 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In some other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting enhanced AGC for full-duplex in millimeter wave systems). For example, the device 1005 or a component of the device 1005 may include a processor 1040 and memory 1030 coupled with or to the processor 1040, the processor 1040 and memory 1030 configured to perform various functions described herein.

The inter-station communications manager 1045 may manage communications with other base stations 105, and may include a controller or scheduler for controlling communications with UEs 115 in cooperation with other base stations 105. For example, the inter-station communications manager 1045 may coordinate scheduling for transmissions to UEs 115 for various interference mitigation techniques such as beamforming or joint transmission. In some examples, the inter-station communications manager 1045 may provide an X2 interface within an LTE/LTE-A wireless communications network technology to provide communication between base stations 105.

The communications manager 1020 may support wireless communication at a wireless device in accordance with examples as disclosed herein. For example, the communications manager 1020 may be configured as or otherwise support a means for performing a first analog to digital conversion of a wireless signal corresponding to a dynamic range to generate a first sample of the wireless signal. The communications manager 1020 may be configured as or otherwise support a means for attenuating the wireless signal by a factor to generate an attenuated wireless signal. The communications manager 1020 may be configured as or otherwise support a means for performing a second analog to digital conversion on the attenuated wireless signal corresponding to the dynamic range to generate a second sample of the attenuated wireless signal. The communications manager 1020 may be configured as or otherwise support a means for amplifying the second sample by the factor. The communications manager 1020 may be configured as or otherwise support a means for outputting one of the first sample or the second sample.

Additionally or alternatively, the communications manager 1020 may support wireless communication at a wireless device in accordance with examples as disclosed herein. For example, the communications manager 1020 may be configured as or otherwise support a means for performing a first analog to digital conversion of a wireless signal to determine an estimated power of the wireless signal. The communications manager 1020 may be configured as or otherwise support a means for attenuating the wireless signal by a factor to generate an attenuated wireless signal based on the estimated power satisfying a threshold. The communications manager 1020 may be configured as or otherwise support a means for performing a second analog to digital conversion on the attenuated wireless signal to generate a sample of the attenuated wireless signal. The communications manager 1020 may be configured as or otherwise support a means for amplifying the sample by the factor based on the estimated power satisfying the threshold. The communications manager 1020 may be configured as or otherwise support a means for outputting the sample.

Additionally or alternatively, the communications manager 1020 may support wireless communication at a wireless device in accordance with examples as disclosed herein. For example, the communications manager 1020 may be configured as or otherwise support a means for determining an estimated input power of a wireless signal received at a first antenna element of a set of multiple antenna elements of the wireless device. The communications manager 1020 may be configured as or otherwise support a means for determining an adjustment to a gain state of each amplifier of a set of multiple amplifiers of the wireless device based on the estimated input power satisfying a threshold. The communications manager 1020 may be configured as or otherwise support a means for amplifying a respective wireless signal of a set of multiple wireless signals received via a respective antenna element of the set of multiple antenna elements to generate set of multiple amplified signals based on the adjustment to the gain state. The communications manager 1020 may be configured as or otherwise support a means for performing an analog to digital conversion on the set of multiple amplified signals to generate a set of multiple samples of the set of multiple wireless signals.

By including or configuring the communications manager 1020 in accordance with examples as described herein, the device 1005 may support techniques for improved communication reliability, reduced latency, improved utilization of processing capability, increased device throughput, reduced signal clipping, reduced signal distortion, increased efficiency for full-duplex communications In some examples, the communications manager 1020 may be configured to perform various operations (e.g., receiving, monitoring, transmitting) using or otherwise in cooperation with the transceiver 1015, the one or more antennas 1025, or any combination thereof. Although the communications manager 1020 is illustrated as a separate component, in some examples, one or more functions described with reference to the communications manager 1020 may be supported by or performed by the processor 1040, the memory 1030, the code 1035, or any combination thereof. For example, the code 1035 may include instructions executable by the processor 1040 to cause the device 1005 to perform various aspects of enhanced AGC for full-duplex in millimeter wave systems as described herein, or the processor 1040 and the memory 1030 may be otherwise configured to perform or support such operations.

Figure 11:
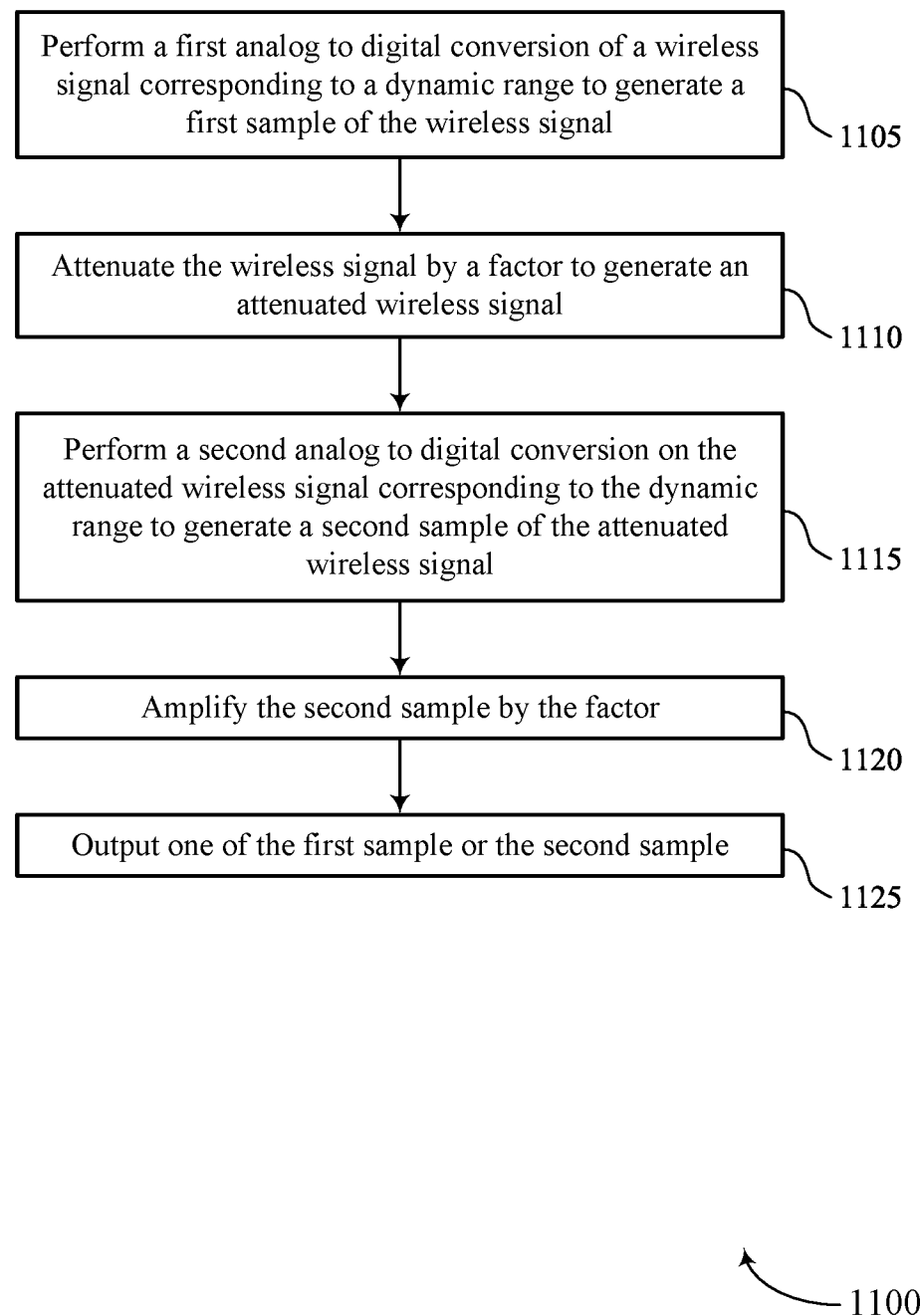
FIGS. 11 through 17 show flowcharts illustrating methods that support enhanced AGC for full-duplex in millimeter wave systems in accordance with aspects of the present disclosure.

FIG. 11 shows a flowchart illustrating a method 1100 that supports enhanced AGC for full-duplex in millimeter wave systems in accordance with aspects of the present disclosure. The operations of the method 1100 may be implemented by a UE or a base station or its components as described herein. For example, the operations of the method 1100 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1105, the method may include performing a first analog to digital conversion of a wireless signal corresponding to a dynamic range to generate a first sample of the wireless signal. The operations of 1105 may be performed in accordance with examples as disclosed herein. In some examples, aspects of the operations of 1105 may be performed by an ADC-M component 825 as described with reference to FIG. 8.

At 1110, the method may include attenuating the wireless signal by a factor to generate an attenuated wireless signal. The operations of 1110 may be performed in accordance with examples as disclosed herein. In some examples, aspects of the operations of 1110 may be performed by an attenuator 830 as described with reference to FIG. 8.

At 1115, the method may include performing a second analog to digital conversion on the attenuated wireless signal corresponding to the dynamic range to generate a second sample of the attenuated wireless signal. The operations of 1115 may be performed in accordance with examples as disclosed herein. In some examples, aspects of the operations of 1115 may be performed by an ADC-S component 835 as described with reference to FIG. 8.

At 1120, the method may include amplifying the second sample by the factor. The operations of 1120 may be performed in accordance with examples as disclosed herein. In some examples, aspects of the operations of 1120 may be performed by an amplifier 840 as described with reference to FIG. 8.

At 1125, the method may include outputting one of the first sample or the second sample. The operations of 1125 may be performed in accordance with examples as disclosed herein. In some examples, aspects of the operations of 1125 may be performed by a DFE output component 845 as described with reference to FIG. 8.

Figure 12:
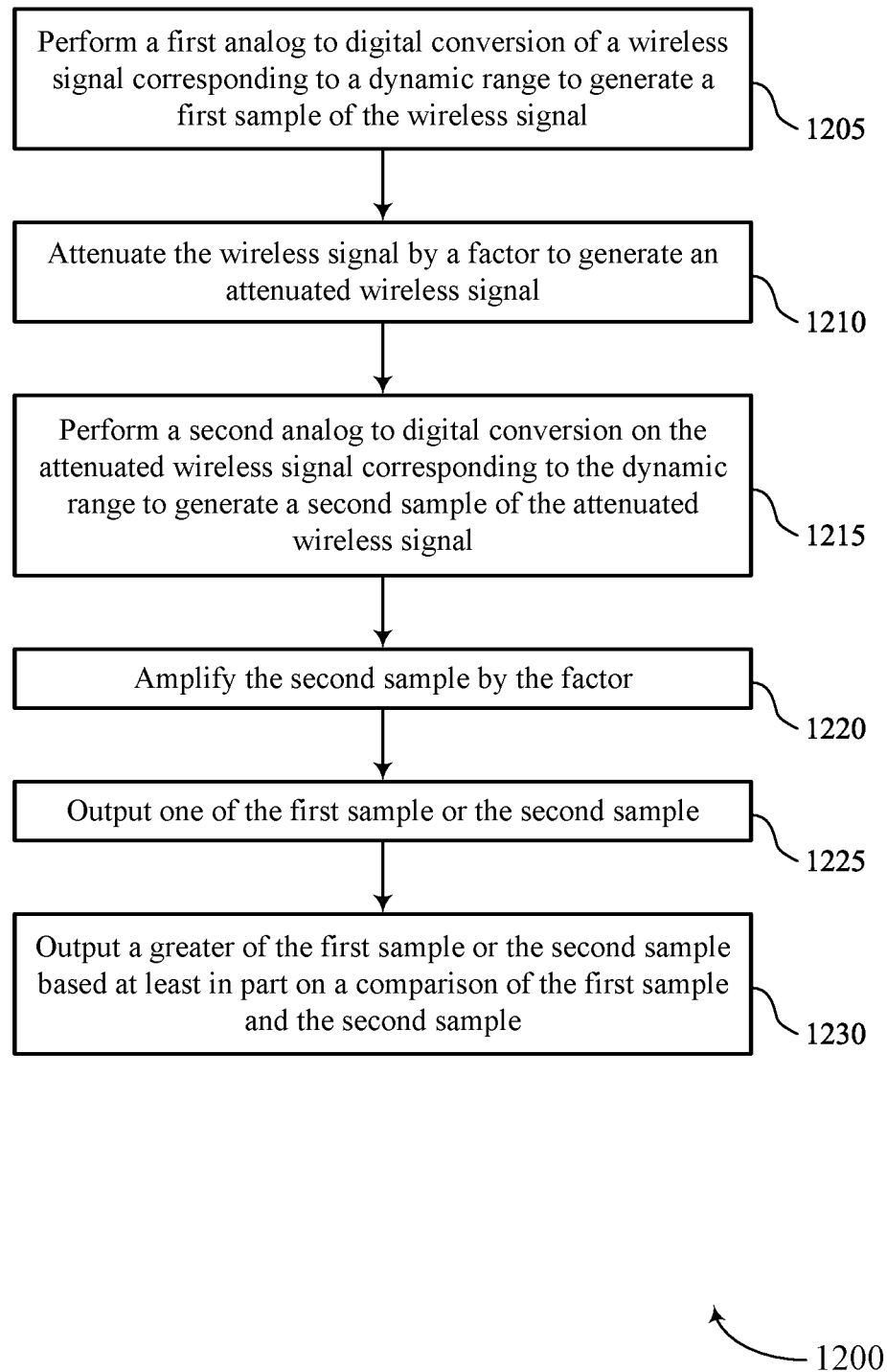

FIG. 12 shows a flowchart illustrating a method 1200 that supports enhanced AGC for full-duplex in millimeter wave systems in accordance with aspects of the present disclosure. The operations of the method 1200 may be implemented by a UE or a base station or its components as described herein. For example, the operations of the method 1200 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1205, the method may include performing a first analog to digital conversion of a wireless signal corresponding to a dynamic range to generate a first sample of the wireless signal. The operations of 1205 may be performed in accordance with examples as disclosed herein. In some examples, aspects of the operations of 1205 may be performed by an ADC-M component 825 as described with reference to FIG. 8.

At 1210, the method may include attenuating the wireless signal by a factor to generate an attenuated wireless signal. The operations of 1210 may be performed in accordance with examples as disclosed herein. In some examples, aspects of the operations of 1210 may be performed by an attenuator 830 as described with reference to FIG. 8.

At 1215, the method may include performing a second analog to digital conversion on the attenuated wireless signal corresponding to the dynamic range to generate a second sample of the attenuated wireless signal. The operations of 1215 may be performed in accordance with examples as disclosed herein. In some examples, aspects of the operations of 1215 may be performed by an ADC-S component 835 as described with reference to FIG. 8.

At 1220, the method may include amplifying the second sample by the factor. The operations of 1220 may be performed in accordance with examples as disclosed herein.

In some examples, aspects of the operations of 1220 may be performed by an amplifier 840 as described with reference to FIG. 8.

At 1225, the method may include outputting one of the first sample or the second sample. The operations of 1225 may be performed in accordance with examples as disclosed herein. In some examples, aspects of the operations of 1225 may be performed by a DFE output component 845 as described with reference to FIG. 8.

At 1230, the method may include outputting a greater of the first sample or the second sample based on a comparison of the first sample and the second sample. The operations of 1230 may be performed in accordance with examples as disclosed herein. In some examples, aspects of the operations of 1230 may be performed by a comparator 860 as described with reference to FIG. 8.

Figure 13:
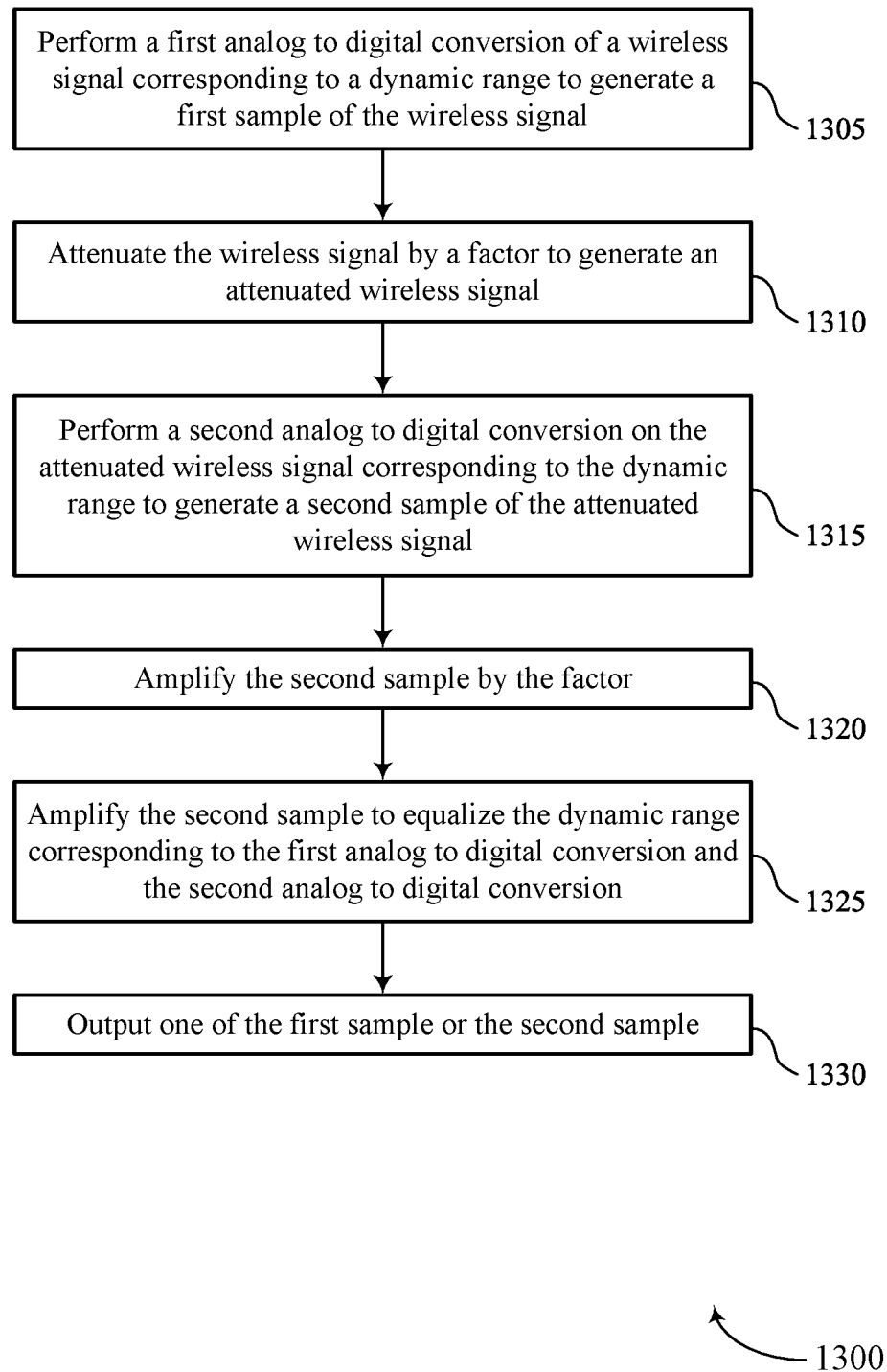

FIG. 13 shows a flowchart illustrating a method 1300 that supports enhanced AGC for full-duplex in millimeter wave systems in accordance with aspects of the present disclosure. The operations of the method 1300 may be implemented by a UE or a base station or its components as described herein. For example, the operations of the method 1300 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1305, the method may include performing a first analog to digital conversion of a wireless signal corresponding to a dynamic range to generate a first sample of the wireless signal. The operations of 1305 may be performed in accordance with examples as disclosed herein. In some examples, aspects of the operations of 1305 may be performed by an ADC-M component 825 as described with reference to FIG. 8.

At 1310, the method may include attenuating the wireless signal by a factor to generate an attenuated wireless signal. The operations of 1310 may be performed in accordance with examples as disclosed herein. In some examples, aspects of the operations of 1310 may be performed by an attenuator 830 as described with reference to FIG. 8.

At 1315, the method may include performing a second analog to digital conversion on the attenuated wireless signal corresponding to the dynamic range to generate a second sample of the attenuated wireless signal. The operations of 1315 may be performed in accordance with examples as disclosed herein. In some examples, aspects of the operations of 1315 may be performed by an ADC-S component 835 as described with reference to FIG. 8.

At 1320, the method may include amplifying the second sample by the factor. The operations of 1320 may be performed in accordance with examples as disclosed herein. In some examples, aspects of the operations of 1320 may be performed by an amplifier 840 as described with reference to FIG. 8.

At 1325, the method may include amplifying the second sample to equalize the dynamic range corresponding to the first analog to digital conversion and the second analog to digital conversion. The operations of 1325 may be performed in accordance with examples as disclosed herein. In some examples, aspects of the operations of 1325 may be performed by an amplifier 840 as described with reference to FIG. 8.

At 1330, the method may include outputting one of the first sample or the second sample. The operations of 1330 may be performed in accordance with examples as disclosed herein. In some examples, aspects of the operations of 1330 may be performed by a DFE output component 845 as described with reference to FIG. 8.

Figure 14:
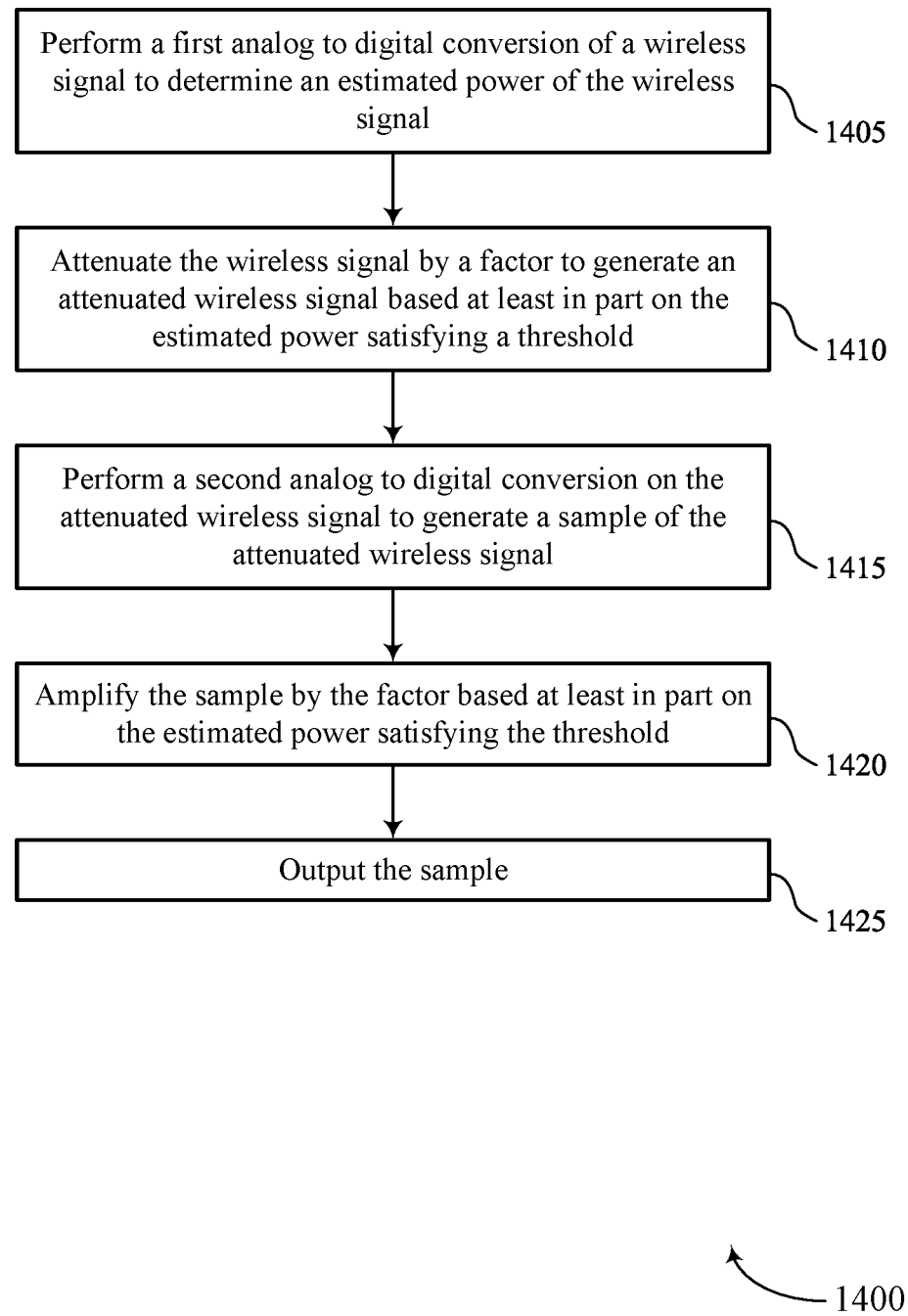

FIG. 14 shows a flowchart illustrating a method 1400 that supports enhanced AGC for full-duplex in millimeter wave systems in accordance with aspects of the present disclosure. The operations of the method 1400 may be implemented by a UE or a base station or its components as described herein. For example, the operations of the method 1400 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1405, the method may include performing a first analog to digital conversion of a wireless signal to determine an estimated power of the wireless signal. The operations of 1405 may be performed in accordance with examples as disclosed herein. In some examples, aspects of the operations of 1405 may be performed by an ADC-S component 835 as described with reference to FIG. 8.

At 1410, the method may include attenuating the wireless signal by a factor to generate an attenuated wireless signal based on the estimated power satisfying a threshold. The operations of 1410 may be performed in accordance with examples as disclosed herein. In some examples, aspects of the operations of 1410 may be performed by an attenuator 830 as described with reference to FIG. 8.

At 1415, the method may include performing a second analog to digital conversion on the attenuated wireless signal to generate a sample of the attenuated wireless signal. The operations of 1415 may be performed in accordance with examples as disclosed herein. In some examples, aspects of the operations of 1415 may be performed by an ADC-M component 825 as described with reference to FIG. 8.

At 1420, the method may include amplifying the sample by the factor based on the estimated power satisfying the threshold. The operations of 1420 may be performed in accordance with examples as disclosed herein. In some examples, aspects of the operations of 1420 may be performed by an amplifier 840 as described with reference to FIG. 8.

At 1425, the method may include outputting the sample. The operations of 1425 may be performed in accordance with examples as disclosed herein. In some examples, aspects of the operations of 1425 may be performed by a DFE output component 845 as described with reference to FIG. 8.

Figure 15:
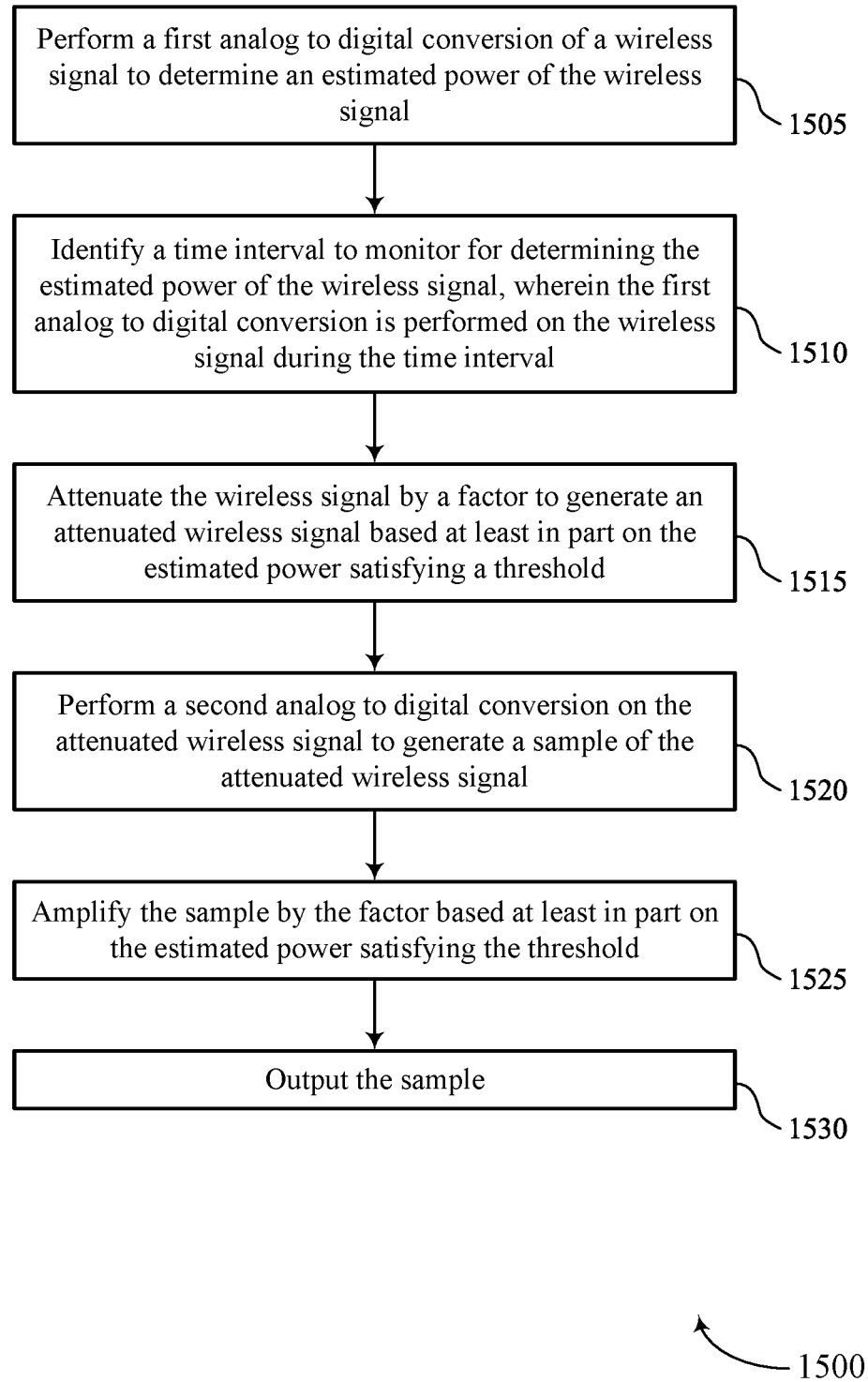

FIG. 15 shows a flowchart illustrating a method 1500 that supports enhanced AGC for full-duplex in millimeter wave systems in accordance with aspects of the present disclosure. The operations of the method 1500 may be implemented by a UE or a base station or its components as described herein. For example, the operations of the method 1500 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1505, the method may include performing a first analog to digital conversion of a wireless signal to determine an estimated power of the wireless signal. The operations of 1505 may be performed in accordance with examples as disclosed herein. In some examples, aspects of the operations of 1505 may be performed by an ADC-S component 835 as described with reference to FIG. 8.

At 1510, the method may include identifying a time interval to monitor for determining the estimated power of the wireless signal, where the first analog to digital conversion is performed on the wireless signal during the time interval. The operations of 1510 may be performed in accordance with examples as disclosed herein. In some examples, aspects of the operations of 1510 may be performed by a timer component 865 as described with reference to FIG. 8.

At 1515, the method may include attenuating the wireless signal by a factor to generate an attenuated wireless signal based on the estimated power satisfying a threshold. The operations of 1515 may be performed in accordance with examples as disclosed herein. In some examples, aspects of the operations of 1515 may be performed by an attenuator 830 as described with reference to FIG. 8.

At 1520, the method may include performing a second analog to digital conversion on the attenuated wireless signal to generate a sample of the attenuated wireless signal. The operations of 1520 may be performed in accordance with examples as disclosed herein. In some examples, aspects of the operations of 1520 may be performed by an ADC-M component 825 as described with reference to FIG. 8.

At 1525, the method may include amplifying the sample by the factor based on the estimated power satisfying the threshold. The operations of 1525 may be performed in accordance with examples as disclosed herein. In some examples, aspects of the operations of 1525 may be performed by an amplifier 840 as described with reference to FIG. 8.

At 1530, the method may include outputting the sample. The operations of 1530 may be performed in accordance with examples as disclosed herein. In some examples, aspects of the operations of 1530 may be performed by a DFE output component 845 as described with reference to FIG. 8.

Figure 16:
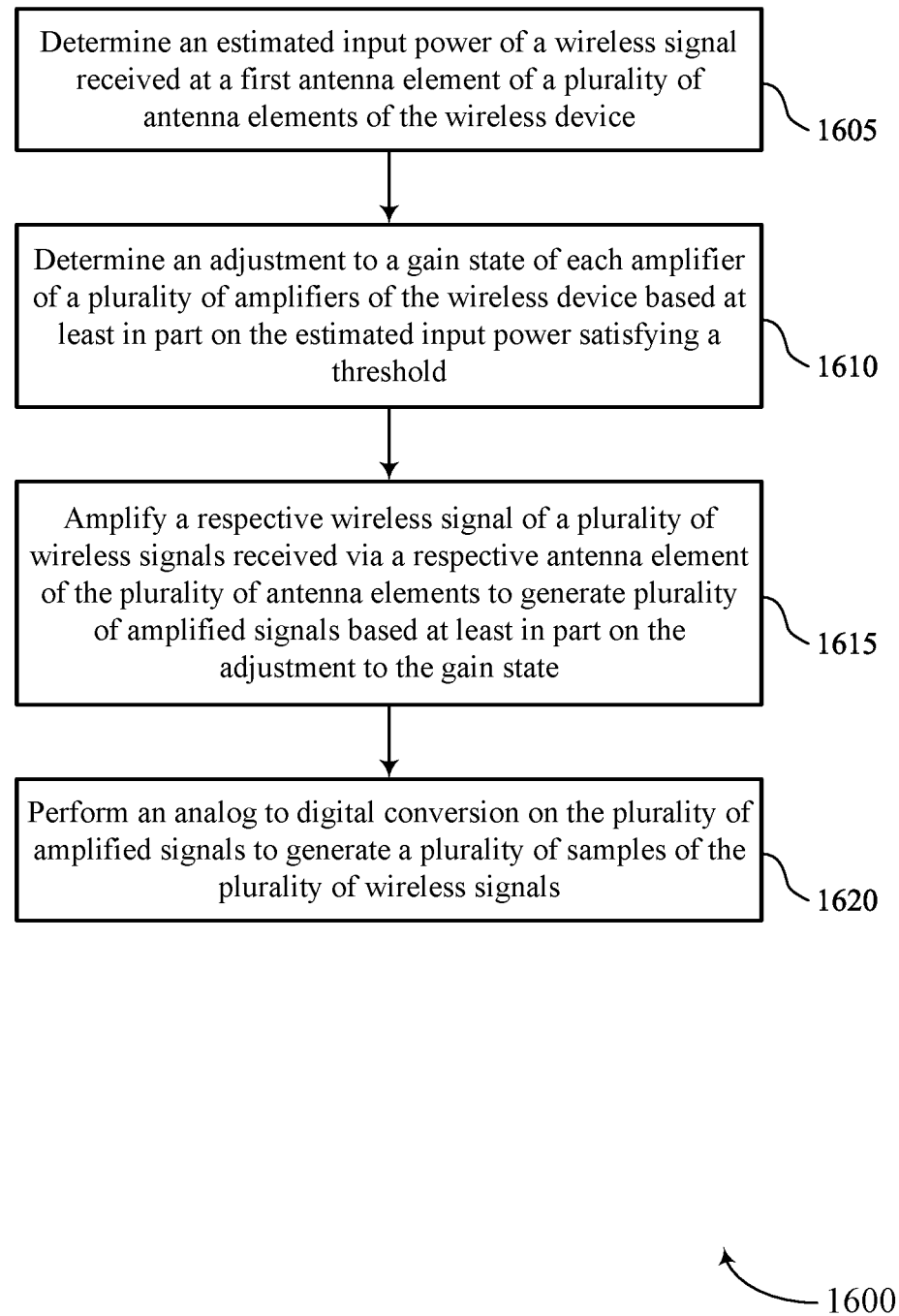

FIG. 16 shows a flowchart illustrating a method 1600 that supports enhanced AGC for full-duplex in millimeter wave systems in accordance with aspects of the present disclosure. The operations of the method 1600 may be implemented by a UE or a base station or its components as described herein. For example, the operations of the method 1600 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1605, the method may include determining an estimated input power of a wireless signal received at a first antenna element of a set of multiple antenna elements of the wireless device. The operations of 1605 may be performed in accordance with examples as disclosed herein. In some examples, aspects of the operations of 1605 may be performed by an RF sensor 850 as described with reference to FIG. 8.

At 1610, the method may include determining an adjustment to a gain state of each amplifier of a set of multiple amplifiers of the wireless device based on the estimated input power satisfying a threshold. The operations of 1610 may be performed in accordance with examples as disclosed herein. In some examples, aspects of the operations of 1610 may be performed by a gain adjustment component 855 as described with reference to FIG. 8.

At 1615, the method may include amplifying a respective wireless signal of a set of multiple wireless signals received via a respective antenna element of the set of multiple antenna elements to generate set of multiple amplified signals based on the adjustment to the gain state. The operations of 1615 may be performed in accordance with examples as disclosed herein. In some examples, aspects of the operations of 1615 may be performed by an amplifier 840 as described with reference to FIG. 8.

At 1620, the method may include performing an analog to digital conversion on the set of multiple amplified signals to generate a set of multiple samples of the set of multiple wireless signals. The operations of 1620 may be performed in accordance with examples as disclosed herein. In some examples, aspects of the operations of 1620 may be performed by an ADC-M component 825 as described with reference to FIG. 8.

Figure 17:
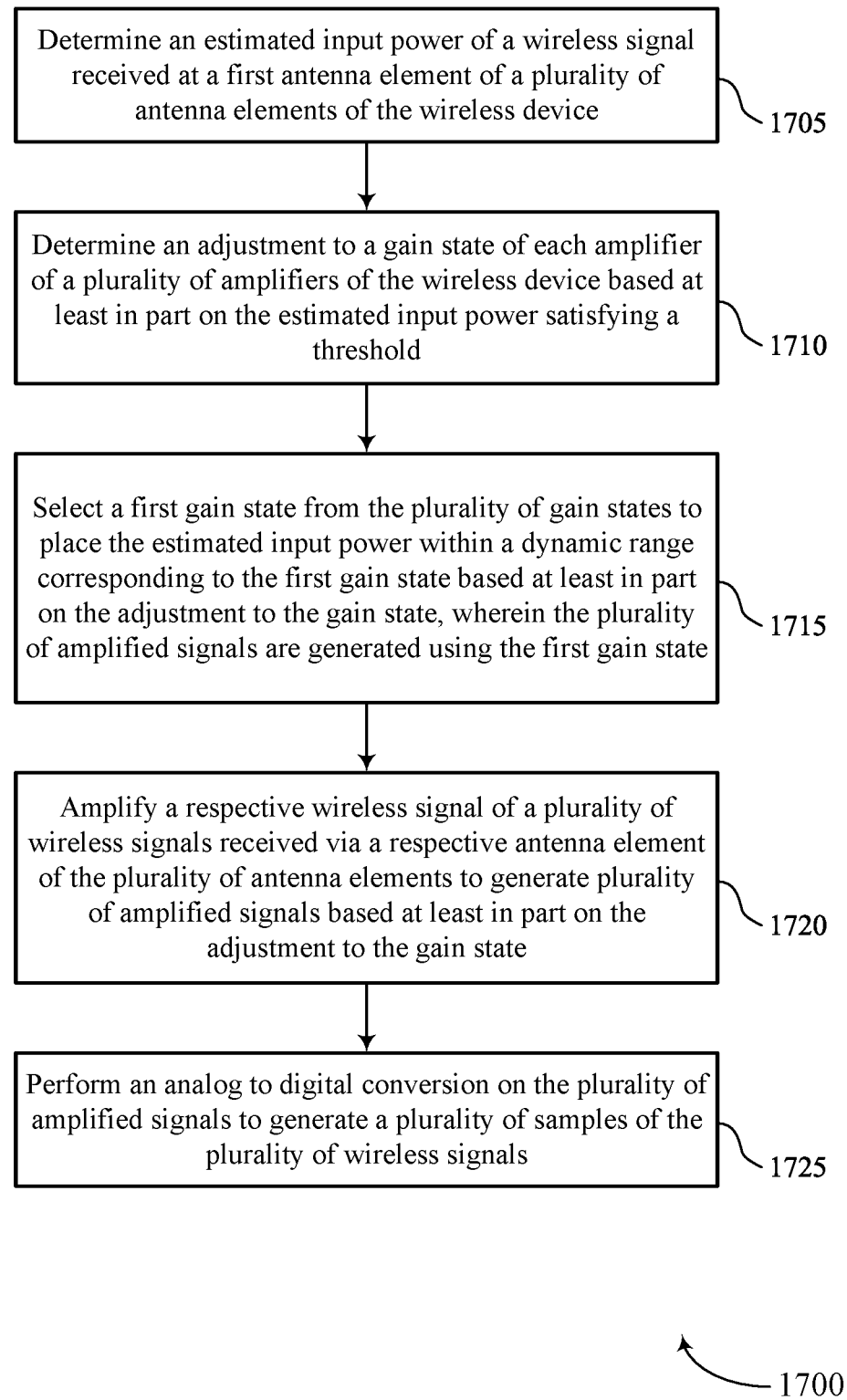

FIG. 17 shows a flowchart illustrating a method 1700 that supports enhanced AGC for full-duplex in millimeter wave systems in accordance with aspects of the present disclosure. The operations of the method 1700 may be implemented by a UE or a base station or its components as described herein. For example, the operations of the method 1700 may be performed by a UE 115 or a base station 105 as described with reference to FIGS. 1 through 10. In some examples, a UE or a base station may execute a set of instructions to control the functional elements of the UE or the base station to perform the described functions. Additionally or alternatively, the UE or the base station may perform aspects of the described functions using special-purpose hardware.

At 1705, the method may include determining an estimated input power of a wireless signal received at a first antenna element of a set of multiple antenna elements of the wireless device. The operations of 1705 may be performed in accordance with examples as disclosed herein. In some examples, aspects of the operations of 1705 may be performed by an RF sensor 850 as described with reference to FIG. 8.

At 1710, the method may include determining an adjustment to a gain state of each amplifier of a set of multiple amplifiers of the wireless device based on the estimated input power satisfying a threshold. The operations of 1710 may be performed in accordance with examples as disclosed herein. In some examples, aspects of the operations of 1710 may be performed by a gain adjustment component 855 as described with reference to FIG. 8.

At 1715, the method may include selecting a first gain state from the set of multiple gain states to place the estimated input power within a dynamic range corresponding to the first gain state based on the adjustment to the gain state, where the set of multiple amplified signals are generated using the first gain state. The operations of 1715 may be performed in accordance with examples as disclosed herein. In some examples, aspects of the operations of 1715 may be performed by a gain adjustment component 855 as described with reference to FIG. 8.

At 1720, the method may include amplifying a respective wireless signal of a set of multiple wireless signals received via a respective antenna element of the set of multiple antenna elements to generate set of multiple amplified signals based on the adjustment to the gain state. The operations of 1720 may be performed in accordance with examples as disclosed herein. In some examples, aspects of the operations of 1720 may be performed by an amplifier 840 as described with reference to FIG. 8.

At 1725, the method may include performing an analog to digital conversion on the set of multiple amplified signals to generate a set of multiple samples of the set of multiple wireless signals. The operations of 1725 may be performed in accordance with examples as disclosed herein. In some examples, aspects of the operations of 1725 may be performed by an ADC-M component 825 as described with reference to FIG. 8.

The following provides an overview of aspects of the present disclosure:

Aspect 1: A method for wireless communication at a wireless device, comprising: performing a first ADC of a wireless signal corresponding to a dynamic range to generate a first sample of the wireless signal; attenuating the wireless signal by a factor to generate an attenuated wireless signal; performing a second ADC on the attenuated wireless signal corresponding to the dynamic range to generate a second sample of the attenuated wireless signal; amplifying the second sample by the factor; and outputting one of the first sample or the second sample.

Aspect 2: The method of aspect 1, wherein the outputting one of the first sample or the second sample further comprises: outputting a greater of the first sample or the second sample based at least in part on a comparison of the first sample and the second sample.

Aspect 3: The method of any of aspects 1 through 2, wherein the dynamic range corresponding to the second ADC is shifted relative to the dynamic range corresponding to the first ADC based at least in part on the attenuating, the method further comprising: amplifying the second sample to equalize the dynamic range corresponding to the first ADC and the second ADC.

Aspect 4: The method of any of aspects 1 through 3, wherein the factor corresponds to a number of decibels for attenuating the wireless signal and for amplifying the second sample.

Aspect 5: The method of any of aspects 1 through 4, wherein the first ADC comprises a main ADC and the second ADC comprises a secondary ADC.

Aspect 6: The method of any of aspects 1 through 5, wherein the wireless signal comprises an in-phase signal, a quadrature signal, or both.

Aspect 7: A method for wireless communication at a wireless device, comprising: performing a first ADC of a wireless signal to determine an estimated power of the wireless signal; attenuating the wireless signal by a factor to generate an attenuated wireless signal based at least in part on the estimated power satisfying a threshold; performing a second ADC on the attenuated wireless signal to generate a sample of the attenuated wireless signal; amplifying the sample by the factor based at least in part on the estimated power satisfying the threshold; and outputting the sample.

Aspect 8: The method of aspect 7, further comprising: identifying a time interval to monitor for determining the estimated power of the wireless signal, wherein the first ADC is performed on the wireless signal during the time interval.

Aspect 9: The method of any of aspects 7 through 8, further comprising: receiving control signaling indicating a time interval to monitor for determining the estimated power of the wireless signal, wherein the first ADC is performed on the wireless signal during the time interval.

Aspect 10: The method of any of aspects 7 through 9, wherein the threshold comprises a voltage saturation threshold associated with the first ADC.

Aspect 11: The method of any of aspects 7 through 10, wherein a number of bits for the estimated power determined by the first ADC is fewer than a number of bits included by the first ADC in the sample of the attenuated wireless signal.

Aspect 12: The method of any of aspects 7 through 11, further comprising: outputting, to a baseband processor of the wireless device, a value of the estimated power of the wireless signal based at least in part on attenuating the wireless signal.

Aspect 13: The method of any of aspects 7 through 12, wherein the factor comprises a number of decibels for attenuating the wireless signal and for amplifying the sample.

Aspect 14: The method of any of aspects 7 through 13, wherein the first ADC comprises a main ADC and the second ADC comprises a secondary ADC.

Aspect 15: A method for wireless communication at a wireless device, comprising: determining an estimated input power of a wireless signal received at a first antenna element of a plurality of antenna elements of the wireless device; determining an adjustment to a gain state of each amplifier of a plurality of amplifiers of the wireless device based at least in part on the estimated input power satisfying a threshold; amplifying a respective wireless signal of a plurality of wireless signals received via a respective antenna element of the plurality of antenna elements to generate plurality of amplified signals based at least in part on the adjustment to the gain state; and performing an ADC on the plurality of amplified signals to generate a plurality of samples of the plurality of wireless signals.

Aspect 16: The method of aspect 15, wherein each amplifier of the plurality of amplifiers has a plurality of gain states, the method further comprising: selecting a first gain state from the plurality of gain states to place the estimated input power within a dynamic range corresponding to the first gain state based at least in part on the adjustment to the gain state, wherein the plurality of amplified signals are generated using the first gain state.

Aspect 17: The method of aspect 16, wherein the adjustment to the gain state corresponds to an increase in a value of the gain state, a power adjustment, or both, the method further comprising: combining the adjustment to the gain state with an outer loop analog bias associated with each amplifier of the plurality of amplifiers; adjusting the gain state of each amplifier of the plurality of amplifiers in accordance with the combining.

Aspect 18: The method of any of aspects 15 through 17, wherein a value of the estimated input power of the wireless signal at the first antenna element differs from a value of the estimated input power of the wireless signal at a second antenna element of the plurality of antenna elements within a threshold power value.

Aspect 19: The method of any of aspects 15 through 18, further comprising: generating the estimated input power at one or more radio frequency sensors associated with the first antenna element, wherein the estimated input power for the first antenna element represents an input power for each antenna element of the plurality of antenna elements.

Aspect 20: The method of aspect 19, wherein the radio frequency sensor is associated with each amplifier of the plurality of amplifiers of the wireless device.

Aspect 21: The method of any of aspects 15 through 20, wherein the threshold comprises a voltage saturation threshold associated with the ADC.

Aspect 22: The method of any of aspects 15 through 21, further comprising: outputting the plurality of samples of the plurality of wireless signals to a base band automatic gain controller of the wireless device.

Aspect 23: The method of any of aspects 15 through 22, further comprising: performing radio frequency band filtering on the plurality of amplified signals to generate a plurality of filtered amplified signals, wherein the ADC is performed on the plurality of filtered amplified signals.

Aspect 24: An apparatus for wireless communication at a wireless device, comprising a processor; memory coupled with the processor; and instructions stored in the memory and executable by the processor to cause the apparatus to perform a method of any of aspects 1 through 6.

Aspect 25: An apparatus for wireless communication at a wireless device, comprising at least one means for performing a method of any of aspects 1 through 6.

Aspect 26: A non-transitory computer-readable medium storing code for wireless communication at a wireless device, the code comprising instructions executable by a processor to perform a method of any of aspects 1 through 6.

Aspect 27: An apparatus for wireless communication at a wireless device, comprising a processor; memory coupled with the processor; and instructions stored in the memory and executable by the processor to cause the apparatus to perform a method of any of aspects 7 through 14.

Aspect 28: An apparatus for wireless communication at a wireless device, comprising at least one means for performing a method of any of aspects 7 through 14.

Aspect 29: A non-transitory computer-readable medium storing code for wireless communication at a wireless device, the code comprising instructions executable by a processor to perform a method of any of aspects 7 through 14.

Aspect 30: An apparatus for wireless communication at a wireless device, comprising a processor; memory coupled with the processor; and instructions stored in the memory and executable by the processor to cause the apparatus to perform a method of any of aspects 15 through 23.

Aspect 31: An apparatus for wireless communication at a wireless device, comprising at least one means for performing a method of any of aspects 15 through 23.

Aspect 32: A non-transitory computer-readable medium storing code for wireless communication at a wireless device, the code comprising instructions executable by a processor to perform a method of any of aspects 15 through 23.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication at a wireless device, comprising:
    performing a first analog to digital conversion of a wireless signal corresponding to a dynamic range to generate a first sample of the wireless signal;
    attenuating the wireless signal by a factor to generate an attenuated wireless signal;
    performing a second analog to digital conversion on the attenuated wireless signal corresponding to the dynamic range to generate a second sample of the attenuated wireless signal, wherein a dynamic range corresponding to the second analog to digital conversion is shifted relative to a dynamic range corresponding to the first analog to digital conversion;
    amplifying the second sample by the factor;
    performing a comparison between the first sample of the wireless signal and the amplified second sample of the wireless signal to determine a greater one of the first sample of the wireless signal or the amplified second sample of the wireless signal; and
    outputting the greater one of the first sample or the amplified second sample based at least in part on the comparison.

2. The method of claim 1, wherein the dynamic range corresponding to the second analog to digital conversion is shifted relative to the dynamic range corresponding to the first analog to digital conversion based at least in part on the attenuating, the method further comprising:
    amplifying the second sample to equalize the dynamic range corresponding to the first analog to digital conversion and the second analog to digital conversion.

3. The method of claim 1, wherein the factor corresponds to a quantity of decibels for attenuating the wireless signal and for amplifying the second sample.

4. The method of claim 1, wherein the first analog to digital conversion comprises a main analog to digital conversion and the second analog to digital conversion comprises a secondary analog to digital conversion.

5. The method of claim 1, wherein the wireless signal comprises an in-phase signal, a quadrature signal, or both.

6. A method for wireless communication at a wireless device, comprising:
    receiving control signaling indicating a quantity of symbol periods to monitor for determining an estimated power of a wireless signal;
    performing a first analog to digital conversion of the wireless signal to determine the estimated power of the wireless signal during the quantity of symbol periods in accordance with the control signaling;
    attenuating the wireless signal by a factor to generate an attenuated wireless signal based at least in part on the estimated power satisfying a threshold;
    outputting, to a baseband processor of the wireless device, a value of the estimated power of the wireless signal based at least in part on attenuating the wireless signal;
    performing a second analog to digital conversion on the attenuated wireless signal to generate a sample of the attenuated wireless signal;
    amplifying the sample by the factor based at least in part on the estimated power satisfying the threshold; and
    outputting the sample.

7. The method of claim 6, further comprising:
    identifying a time interval to monitor for determining the estimated power of the wireless signal, wherein the first analog to digital conversion is performed on the wireless signal during the time interval, and wherein the time interval comprises the quantity of symbol periods.

8. The method of claim 6, wherein the threshold comprises a voltage saturation threshold associated with the first analog to digital conversion.

9. The method of claim 6, wherein a first quantity of bits for the estimated power determined by the first analog to digital conversion is fewer than a second quantity of bits included by the first analog to digital conversion in the sample of the attenuated wireless signal.

10. The method of claim 6, wherein the factor comprises a quantity of decibels for attenuating the wireless signal and for amplifying the sample.

11. The method of claim 6, wherein the first analog to digital conversion comprises a main analog to digital conversion and the second analog to digital conversion comprises a secondary analog to digital conversion.

12. An apparatus for wireless communication, comprising:

a first analog to digital converter configured to perform a first analog to digital conversion of a wireless signal corresponding to a dynamic range to generate a first sample of the wireless signal;

an attenuator configured to attenuate the wireless signal by a factor to generate an attenuated wireless signal;

a second analog to digital converter configured to perform a second analog to digital conversion on the attenuated wireless signal corresponding to the dynamic range to generate a second sample of the attenuated wireless signal, wherein a dynamic range corresponding to the second analog to digital conversion is shifted relative to a dynamic range corresponding to the first analog to digital conversion;

an amplifier configured to amplify the second sample by the factor; and a comparator configured to:
  perform a comparison between of the first sample of the wireless signal and the amplified second sample of the wireless signal to determine a greater one of the first sample of the wireless signal or the amplified second sample of the wireless signal; and
  output the greater one of the first sample or the amplified second sample.

13. The apparatus of claim 12, wherein the dynamic range corresponding to the second analog to digital conversion is shifted relative to the dynamic range corresponding to the first analog to digital conversion based at least in part on the attenuating of the wireless signal, the amplifier further configured to:
  amplify the second sample to equalize the dynamic range corresponding to the first analog to digital conversion and the second analog to digital conversion.

14. The apparatus of claim 12, wherein the factor comprises a quantity of decibels for attenuating the wireless signal and for amplifying the second sample.

15. The apparatus of claim 12, wherein the first analog to digital converter comprises a main analog to digital converter and the second analog to digital converter comprises a secondary analog to digital converter.

16. The apparatus of claim 12, wherein the wireless signal comprises an in-phase signal, a quadrature signal, or both.

17. An apparatus for wireless communication at a wireless device, comprising:
  a control signal receiving component configured to receive control signaling indicating a quantity of symbol periods to monitor for determining an estimated power of a wireless signal;
  a first analog to digital converter configured to perform a first analog to digital conversion of the estimated power of the wireless signal during the quantity of symbol periods in accordance with the control signaling;
  an attenuator configured to attenuate the wireless signal by a factor to generate an attenuated wireless signal based at least in part on the estimated power satisfying a threshold;
  a digital front end component configured to output, to a baseband processor of the wireless device, a value of the estimated power of the wireless signal based at least in part on attenuation of the wireless signal;
  a second analog to digital converter configured to perform a second analog to digital conversion on the attenuated wireless signal to generate a sample of the attenuated wireless signal; and
  an amplifier configured to amplify the sample by the factor based at least in part on the estimated power satisfying the threshold; wherein the digital front end component is further configured to:
    output the sample.

18. The apparatus of claim 17, further comprising:
  a timer component configured to identify a time interval to monitor for determining the estimated power of the wireless signal, wherein the first analog to digital conversion is performed on the wireless signal during the time interval, and wherein the time interval comprises the quantity of symbol periods.

19. The apparatus of claim 17, wherein the threshold comprises a voltage saturation threshold associated with the first analog to digital conversion.

20. The apparatus of claim 17, wherein a first quantity of bits for the estimated power determined by the first analog to digital conversion is fewer than a second quantity of bits included by the first analog to digital conversion in the sample of the attenuated wireless signal.

21. The apparatus of claim 17, wherein the factor comprises a quantity of decibels for attenuating the wireless signal and for amplifying the sample.

22. The apparatus of claim 17, wherein the first analog to digital converter comprises a main analog to digital converter and the second analog to digital converter comprises a secondary analog to digital converter.

* * * * *